US012610519B2

(12) United States Patent
Wang et al.

(10) Patent No.: US 12,610,519 B2
(45) Date of Patent: Apr. 21, 2026

(54) SEMICONDUCTOR STRUCTURE AND MANUFACTURING METHOD THEREOF

(71) Applicant: NANYA TECHNOLOGY CORPORATION, New Taipei City (TW)

(72) Inventors: Mao-Ying Wang, New Taipei City (TW); Yu-Ting Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 364 days.

(21) Appl. No.: 18/338,345

(22) Filed: Jun. 21, 2023

(65) Prior Publication Data
US 2024/0431091 A1 Dec. 26, 2024

(51) Int. Cl.
*H10B 12/00* (2023.01)

(52) U.S. Cl.
CPC ........... *H10B 12/09* (2023.02); *H10B 12/315* (2023.02); *H10B 12/482* (2023.02); *H10B 12/488* (2023.02); *H10B 12/50* (2023.02)

(58) Field of Classification Search
CPC .... H10B 12/053; H10B 12/09; H10B 12/315; H10B 12/34; H10B 12/482; H10B 12/488; H10B 12/50
See application file for complete search history.

(56) References Cited

U.S. PATENT DOCUMENTS

| | | | |
|---|---|---|---|
| 11,309,316 B1 | 4/2022 | Chen et al. | |
| 2019/0386010 A1* | 12/2019 | Tomoyama | ............ H10B 12/09 |
| 2022/0037345 A1* | 2/2022 | Tsai | ........................ H10B 41/42 |
| 2022/0059447 A1* | 2/2022 | Shu | ................... H01L 21/76897 |
| 2023/0039823 A1* | 2/2023 | Jeong | .................. H10B 12/315 |
| 2023/0301056 A1* | 9/2023 | Wu | ...................... H10B 12/482 |
| 2024/0147696 A1* | 5/2024 | Park | ...................... H10B 12/34 |
| 2024/0284664 A1* | 8/2024 | Kim | ...................... H10B 12/09 |

FOREIGN PATENT DOCUMENTS

| | | |
|---|---|---|
| TW | 202310187 A1 | 3/2023 |
| TW | 202322361 A | 6/2023 |

* cited by examiner

*Primary Examiner* — Edward Chin
(74) *Attorney, Agent, or Firm* — CKC & Partners Co., LLC

(57) ABSTRACT

A manufacturing method of a semiconductor structure includes forming an active area in a substrate, in which the substrate has an array region and a peripheral region adjacent to the array region. A word line structure is formed in the array region of the substrate. A first protection layer is formed covering the active area and the word line structure. A hard mask stack is formed on the first protection layer. A bit line feature is formed in the first protection layer. After forming the bit line feature, a gate dielectric layer is formed on the active area in the peripheral region of the substrate. A gate electrode layer is formed on the gate dielectric layer.

13 Claims, 22 Drawing Sheets

SEMICONDUCTOR STRUCTURE AND MANUFACTURING METHOD THEREOF

BACKGROUND

Field of Disclosure

The present disclosure relates to a semiconductor structure and a manufacturing method of the semiconductor structure.

Description of Related Art

As the scale of a semiconductor structure becomes smaller and smaller, processes of manufacturing the semiconductor structure becomes difficult. The semiconductor structure may be configured to store digital data. A plurality of word lines connected with transistors are able to turn on or turn off the transistors. If the transistors are on, the transistors may connect with capacitors to charge or discharge the capacitors, and data may be written or read by bit lines connected to the transistors.

Moreover, there are some challenges in the manufacturing process of the semiconductor structure. The planarity of a mask stack and underlying layers may affect the performance of the semiconductor structure, in which the mask stack is used to form bit lines. Therefore, a semiconductor structure and the manufacturing method thereof are in need for improving the performance of the semiconductor structure.

SUMMARY

One aspect of the present disclosure is a manufacturing method of a semiconductor structure.

According to some other embodiments of the present disclosure, a manufacturing method of a semiconductor structure includes forming an active area in a substrate, in which the substrate has an array region and a peripheral region adjacent to the array region. A word line structure is formed in the array region of the substrate. A first protection layer is formed covering the active area and the word line structure. A hard mask stack is formed on the first protection layer. A bit line feature is formed in the first protection layer. After forming the bit line feature, a gate dielectric layer is formed on the active area in the peripheral region of the substrate. A gate electrode layer is formed on the gate dielectric layer.

In some embodiments of the present disclosure, forming the hard mask stack includes forming a first hard mask layer covering the first protection layer and forming a second hard mask layer covering the first hard mask layer. The first hard mask layer includes carbon.

In some embodiments of the present disclosure, forming the bit line feature includes forming an opening in the first protection layer by using the hard mask stack as an etch mask. A first conductive layer is formed in the opening and formed on the first protection layer. A planarization process is performed to form the bit line feature in the first protection layer over the array region of the substrate.

In some embodiments of the present disclosure, forming the opening in the first protection layer further includes etching a portion of the active area.

In some embodiments of the present disclosure, the manufacturing method further includes removing the hard mask stack to expose a top surface of the first protection layer prior to forming the first conductive layer.

In some embodiments of the present disclosure, the manufacturing method further includes etching the first protection layer over the peripheral region of the substrate to expose the active area in the peripheral region of the substrate after forming the bit line feature.

In some embodiments of the present disclosure, forming the gate electrode layer includes forming a second conductive layer on the gate dielectric layer over the peripheral region of the substrate and on the first protection layer over the array region of the substrate. An etching process is performed to remove the second conductive layer over the array region of the substrate such that the bit line feature is exposed. The second conductive layer over the peripheral region of the substrate is patterned to form the gate electrode layer.

In some embodiments of the present disclosure, performing the etching process further includes etching a portion of the bit line feature.

In some embodiments of the present disclosure, the etching process is performed such that a top surface and a sidewall of the first protection layer are exposed.

In some embodiments of the present disclosure, the manufacturing method further includes forming a conductive structure over the array region of the substrate and over the peripheral region of the substrate. The conductive structure over the peripheral region of the substrate is patterned to form a gate conductor.

In some embodiments of the present disclosure, forming the conductive structure is performed such that the third conductor layer has a portion in the first protection layer.

In some embodiments of the present disclosure, the manufacturing method further includes forming a second protection layer on the conductive structure. The second protection layer over the peripheral region of the substrate is patterned to form a cap layer.

In some embodiments of the present disclosure, the manufacturing method further includes forming an isolation structure adjacent to the active area, in which the word line structure includes a dielectric layer and a word line, the dielectric layer covers a sidewall of the active area, and the word line is between the isolation structure and the active area.

Another aspect of the present disclosure is a semiconductor structure.

According to some other embodiments of the present disclosure, a semiconductor structure includes an active area in a substrate, a word line structure, a protection layer, a bit line feature, a gate dielectric layer and a gate electrode layer. The substrate has an array region and a peripheral region adjacent to the array region. The word line structure is located in the array region of the substrate. The protection layer covers the active area and the word line structure. The bit line feature is located in the protection layer, in which a top surface of the bit line feature is below a top surface of the protection layer. The gate dielectric layer and the gate electrode layer are located on the peripheral region of the substrate.

In some embodiments of the present disclosure, the bit line feature and the gate electrode layer include the same material.

In some embodiments of the present disclosure, the semiconductor structure further includes a gate conductor located on the gate electrode layer.

In some embodiments of the present disclosure, the semiconductor structure further includes a conductive structure located on the protection layer and the bit line feature, in which the conductive structure has a portion in the protection layer, and the conductive structure and the gate conductor include the same material.

In some embodiments of the present disclosure, the semiconductor structure further includes an isolation structure located adjacent to the active area, in which a bottom surface of the bit line feature is below a top surface of the isolation structure.

In some embodiments of the present disclosure, the word line structure includes a dielectric layer and a word line, the dielectric layer covers a sidewall of the active area, and the word line is disposed between the isolation structure and the active area.

In some embodiments of the present disclosure, the semiconductor structure further includes an isolation layer located over the array region of the substrate, in which the isolation layer is located between the protection layer and the active area.

In the aforementioned embodiments of the present disclosure, since forming the gate dielectric layer on the active area in the peripheral region of the substrate is performed after forming the bit line feature, the planarity of the hard mask stack (e.g., a first top surface of the hard mask stack over the array region of the substrate is substantially coplanar with a second top surface of the hard mask stack over the peripheral region the substrate) and underlying layers can be improved, thereby avoiding or preventing from forming voids in the hard mask stack.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
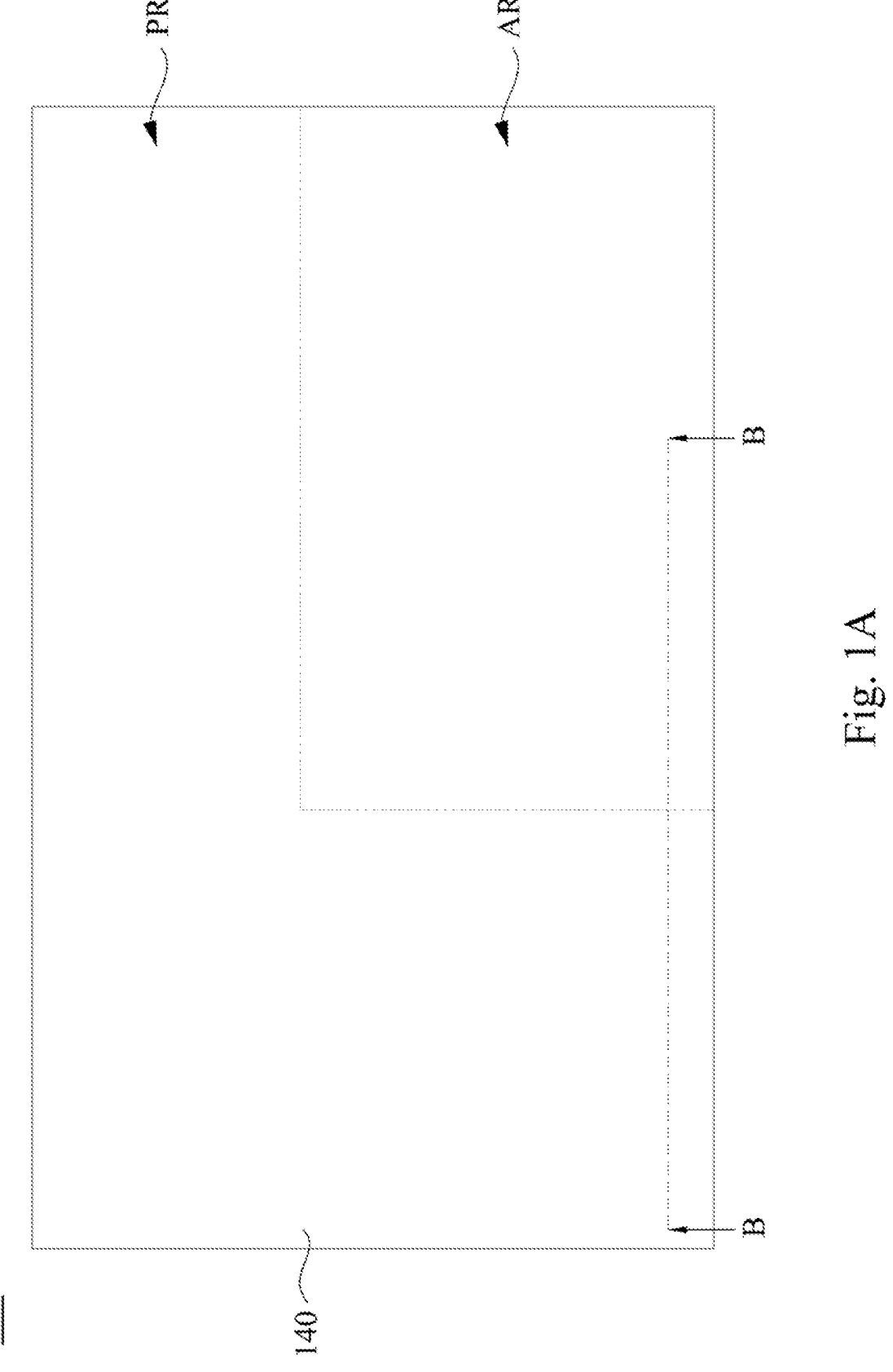
FIGS. 1A, 2A, 3A, 4A, 5A, 6A, 7A, 8A, 9A, 10A and 11A are top views of a process at various stages of a manufacturing method of a semiconductor structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around", "about", "approximately", or "substantially" shall generally mean within 10 percent, or within 5 percent of a given value or range. Numerical quantities given herein are approximated, meaning that the term "around", "about", "approximately", or "substantially" can be inferred if not expressly stated.

In the embodiments of the present disclosure, a semiconductor structure and a manufacturing method of the same are provided. FIGS. 1A-1B, 2A-2B, 3A-3B, 4A-4B, 5A-5B, 6A-6B, 7A-7B, 8A-8B, 9A-9B, 10A-10B and 11A-11B are views of a process at various stages of a manufacturing method of a semiconductor structure 100 according to some embodiments of the present disclosure.

Figure 1B:
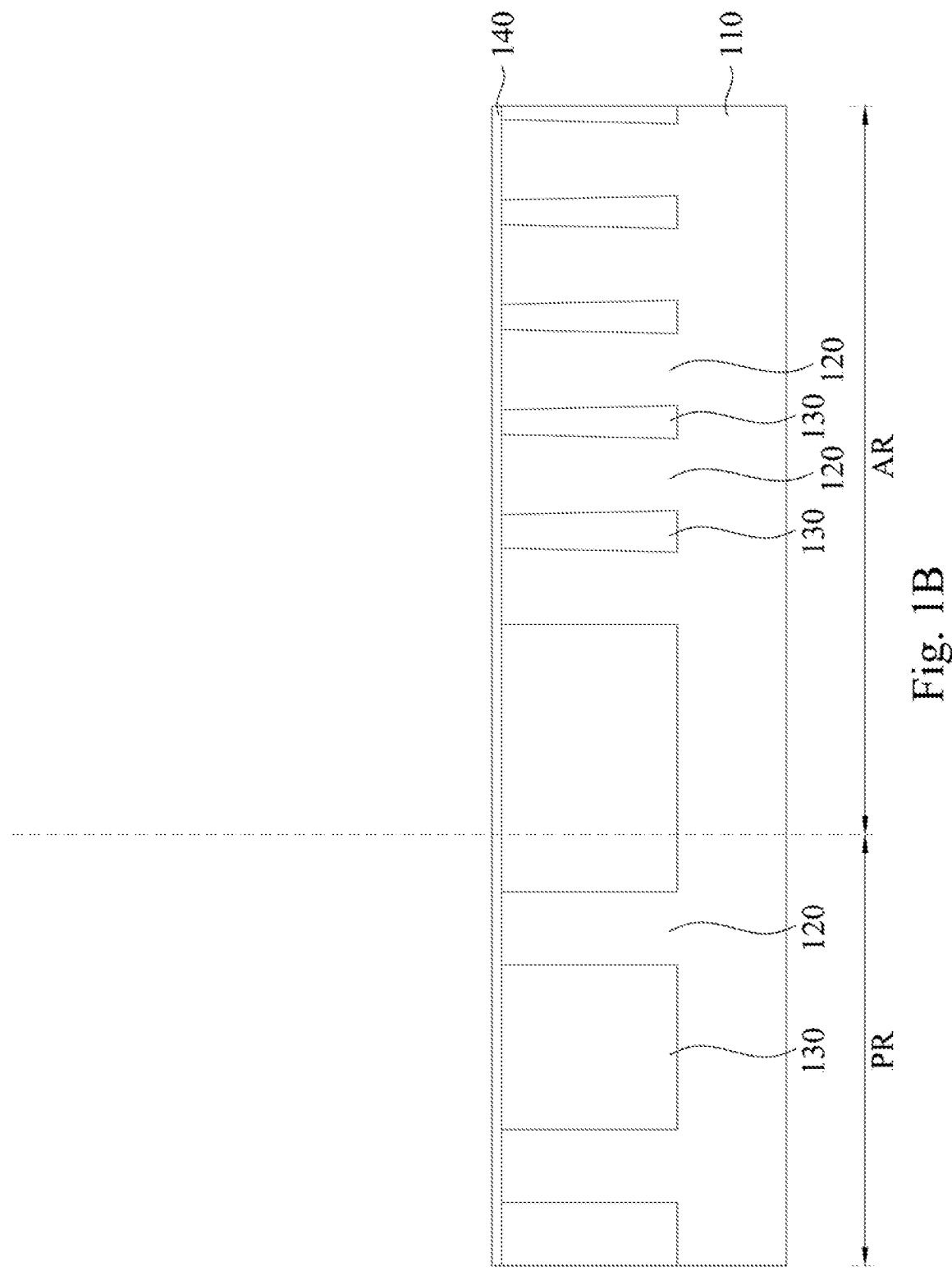
FIGS. 1B, 2B, 3B, 4B, 5B, 6B, 7B, 8B, 9B, 10B and 11B are cross-sectional views of a process at various stages of a manufacturing method of a semiconductor structure according to some embodiments of the present disclosure.

FIG. 1A is a top view of a step of manufacturing the semiconductor structure 100, and FIG. 1B is a cross-sectional view of the semiconductor structure 100 taken along line B-B in FIG. 1A. Referring to FIGS. 1A and 1B, active areas 120 are formed in a substrate 110, in which the substrate 110 has an array region AR and a peripheral region PR adjacent to the array region AR. In some embodiments, the peripheral region PR surrounds the array region AR. In some embodiments, the substrate 110 includes silicon. In some other embodiments, the substrate 110 includes another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The active areas 120 may be formed in the substrate 110 by performing an etching process to form trenches in the substrate 110. As a result, the active areas 120 are defined in the substrate 110. In some embodiments, the etching process may include dry etching, wet etching, and/or other etching methods (e.g., reactive ion etching). In some embodiments, an implantation process is performed on the active areas 120 with N-type dopants such as phosphorous (P), arsenic (As), antimony (Sb), combinations thereof, or the like. Alternatively, an implantation process is performed on the active areas 120 with P-type dopants such as boron (B), $BF_2$, $BF_3$, combinations thereof, or the like. An anneal process may be performed to repair implant damage and to activate the implanted dopants.

After forming the active areas 120, isolation structures 130 are formed over the substrate 110 and adjacent to the active areas 120. Specifically, the isolation structures 130 are located between adjacent active areas 120. The isolation structures 130 are formed to surround the active areas 120 for proper electrical isolation. In some embodiments, the isolation structures 130 are shallow trench isolation (STI). The isolation structures 130 may include oxide, such as silicon oxide, a nitride, such as silicon nitride, the like, or a combination thereof. The isolation structures 130 may be formed by a chemical vapor deposition (CVD) process, such as high density plasma CVD (HDP-CVD), flowable chemical vapor deposition (FCVD), the like, or a combination thereof. In some embodiments, the semiconductor structure 100 further includes other insulation structures (not shown) between the active areas 120 and the isolation structures 130, in which the insulation structures and the isolation structures 130 includes different dielectric materials. For example, the insulation structures include nitride (e.g., silicon nitride) and the isolation structures 130 include oxide (e.g., silicon oxide).

After the active areas 120 and the isolation structures 130 are formed, an isolation layer 140 is formed over the array region AR of the substrate 110 and over the peripheral region PR of the substrate 110. In other words, the isolation layer 140 is formed on the active areas 120 and the isolation structures 130. The isolation layer 140 may be formed by using a chemical vapor deposition process, an atomic layer deposition process, a physical vapor deposition process or other suitable deposition processes. The isolation layer 140 includes nitride (e.g., silicon nitride) or other suitable dielectric materials.

Figure 2A:
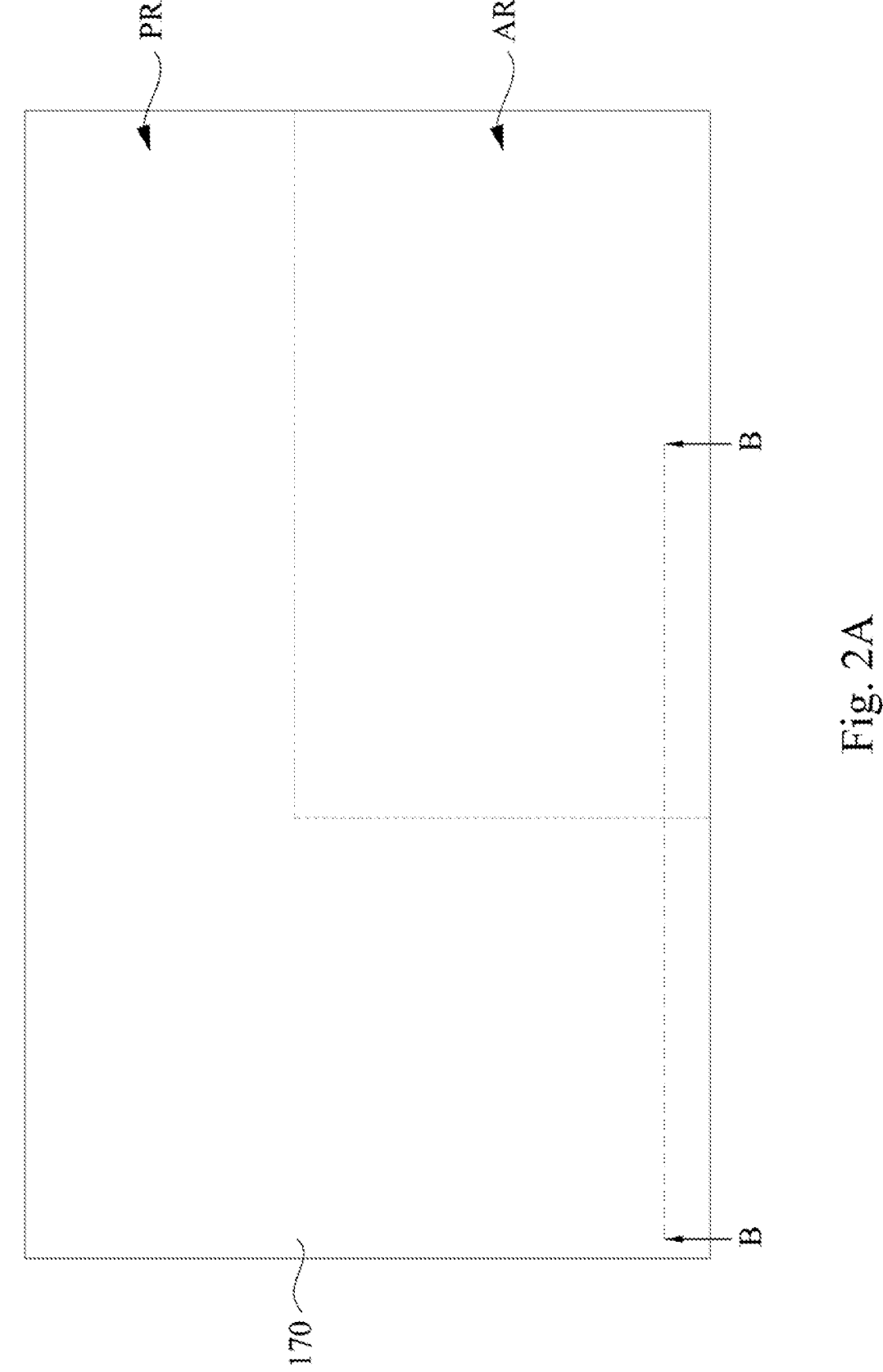
Figure 2B:
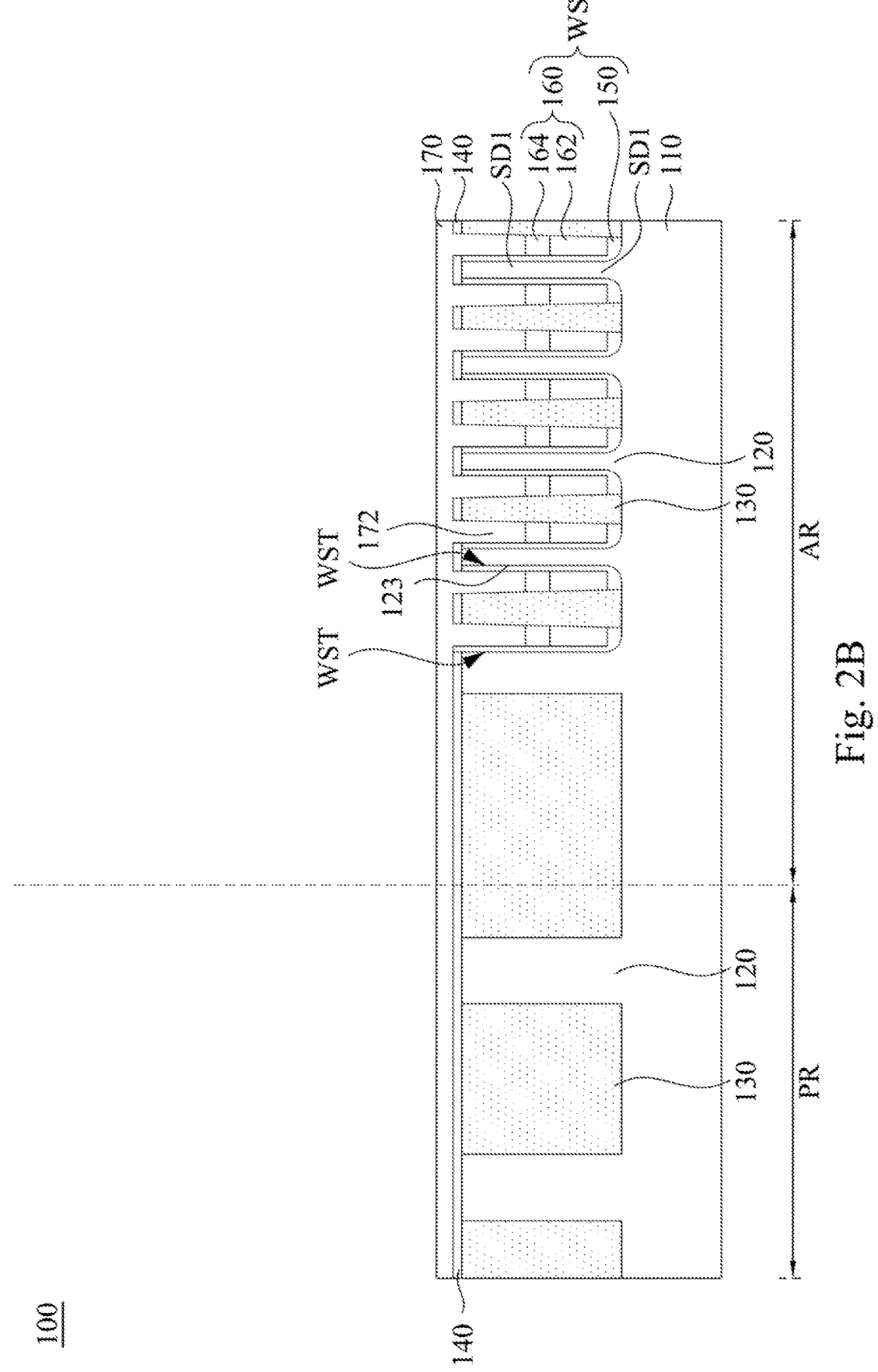

FIG. 2A is a top view of a step of manufacturing the semiconductor structure 100, and FIG. 2B is a cross-sectional view of the semiconductor structure 100 taken along line B-B in FIG. 2A. Referring to FIGS. 2A and 2B, word line structures WS are formed in the array region AR of the substrate 110. In some embodiments, forming the word line structures WS includes etching a portion of the active areas 120 to form trenches WST between the active areas 120 and the isolation structures 130, and then forming the word line structures WS (e.g., dielectric layers 150 and word lines 160) in the trenches WST. In greater details, each of the word line structure WS includes a dielectric layer 150 and a word line 160. The dielectric layer 150 covers a sidewall 123 of one of the active areas 120, and the word line 160 is located between one of the isolation structures 130 and the adjacent active area 120. In some embodiments, the active areas 120 and the word lines 160 are arranged alternatively. The active areas 120 are in contact with the dielectric layers 150, while the active areas 120 are separated from the word lines 160 by the dielectric layers 150. In some embodiments, each of the word lines 160 is located along a sidewall of each of the isolation structures 130. In some embodiments, each of the word lines 160 includes a first portion 162 and a second portion 164 on the first portion 162. The first portion 162 and the second portion 164 of the word line 160 may include different materials. For example, the first portion 162 of the word line 160 includes metal, and the second portion 164 of the word line 160 includes semiconductor materials (e.g., polysilicon). In some embodiments, second portion 164 of the word line 160 is referred as a work function tuning layer. In some embodiments, the dielectric layers 150 are respectively between the word lines 160 and the active area 120. Each of the dielectric layers 150 is in contact with a bottom surface and a sidewall of the respectively word line 160. In some embodiments, the dielectric layers 150 includes oxide (e.g., silicon oxide), a high-k dielectric material, other suitable dielectric material, and/or combinations thereof. In some embodiments, source/drain regions SD1 of the active areas 120 and the word line structures WS are referred as transistors in the array region AR.

After the word line structure WS is formed in the array region AR of the substrate 110, the first protection layer 170 is formed over the array region AR of the substrate 110 and the peripheral region PR of the substrate 110. In greater details, the first protection layer 170 is formed covering the active areas 120 and the word line structure WS, and the first protection layer 170 is in contact with the word lines 160, the dielectric layer 150 and the isolation layer 140. In some embodiments, the first protection layer 170 has portions 172 respective between the active areas 120 and the isolation structures 130. In some embodiments, the first protection layer 170 includes nitride, such as silicon nitride. In some embodiments, the first protection layer 170 and the isolation layer 140 include the same material. In some embodiments, a portion of the active area 120 is covered by the word line 160, while the remaining portions of the active area 120 is covered by the first protection layer 170.

Figure 3A:
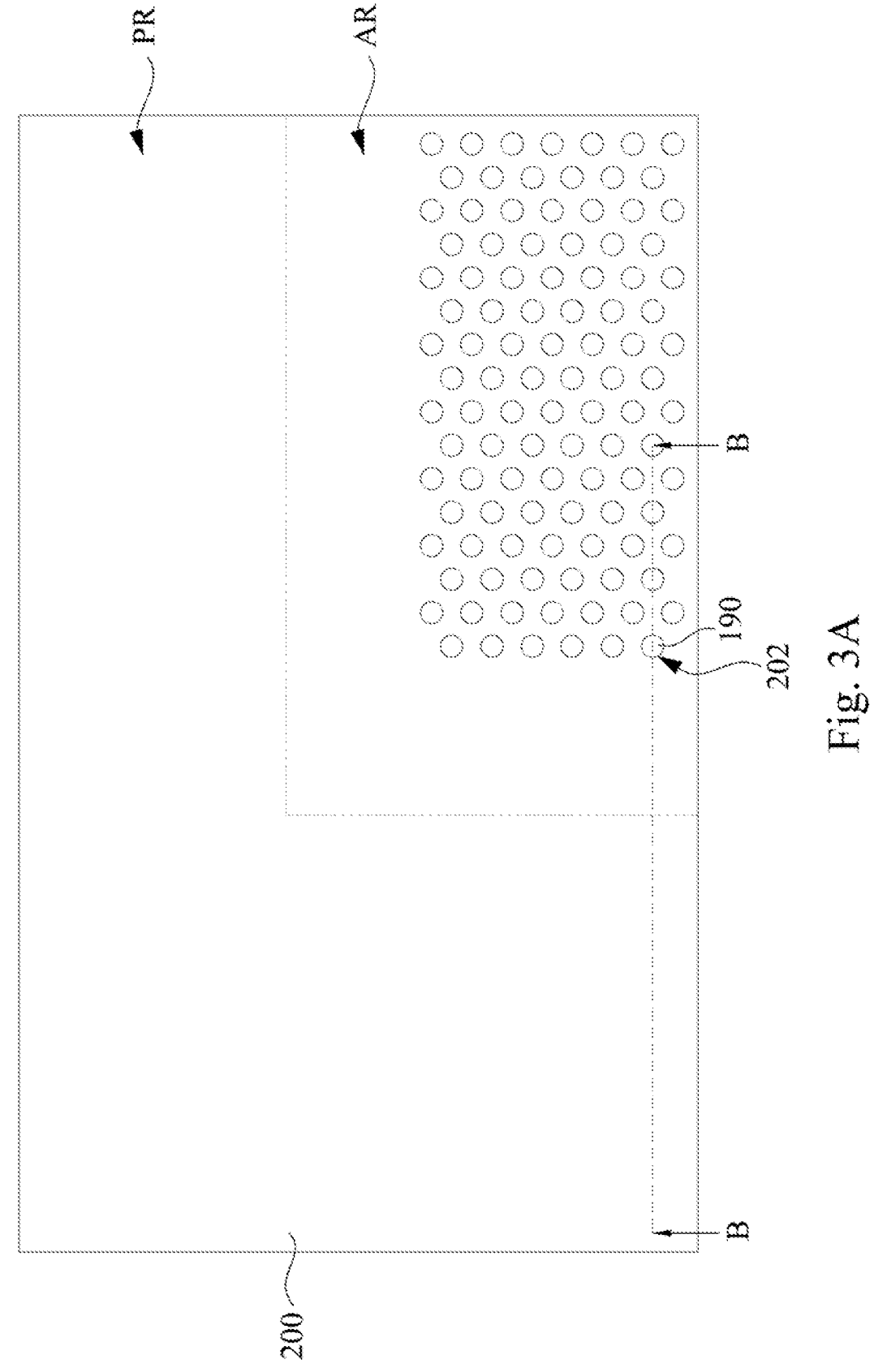
Figure 3B:
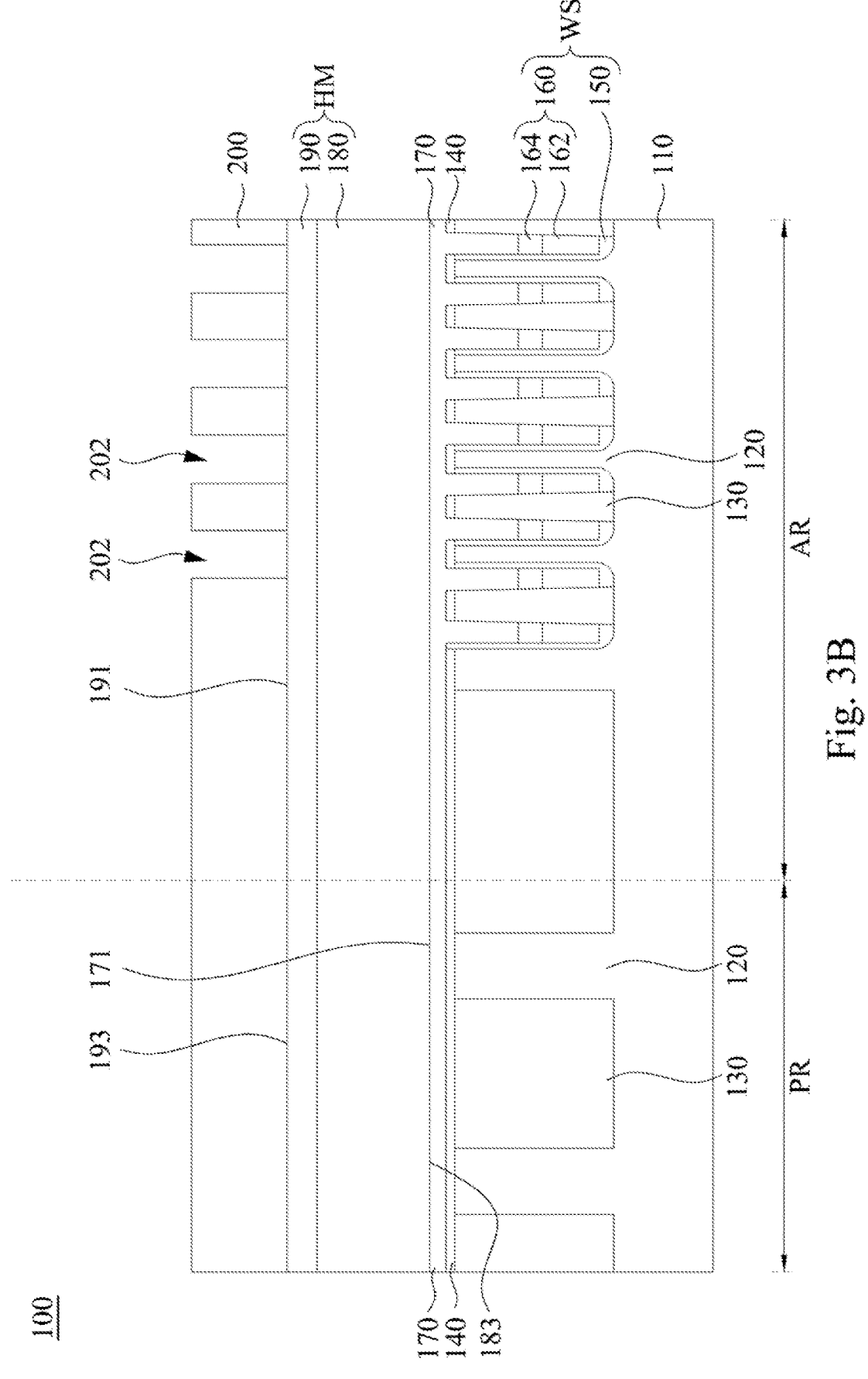

FIG. 3A is a top view of a step of manufacturing the semiconductor structure 100, and FIG. 3B is a cross-sectional view of the semiconductor structure 100 taken along line B-B in FIG. 3A. Referring to FIGS. 3A and 3B, after forming the first protection layer 170, a hard mask stack HM is formed on the first protection layer 170. In some embodiments, the hard mask stack HM includes a first hard mask layer 180 and a second hard mask layer 190. The first hard mask layer 180 covers the first protection layer 170, and the second hard mask layer 190 covers the first hard mask layer 180. The first hard mask layer 180 is in contact with the first protection layer 170, and the second hard mask layer 190 is in contact with the first hard mask layer 180. In some embodiments, an entirety of the first hard mask layer 180 of the hard mask stack HM is formed over the first protection layer 170. In other words, a bottommost surface 183 of the first hard mask layer 180 is in contact with and coplanar with (i.e., at the same horizontal level as) a topmost surface 171 of the first protection layer 170. In some embodiments, the first hard mask layer 180 and the second hard mask layer 190 includes different materials. For example, the first hard mask layer 180 includes carbon, and the second hard mask layer 190 includes nitride (e.g., silicon nitride). Since a gate fabrication process (e.g., forming a gate dielectric layer and a gate electrode layer) over the peripheral region PR of the substrate 110 is performed after forming the hard mask stack HM, the planarity of the hard mask stack HM (e.g., a top surface 191 of the hard mask stack HM over the array region AR of the substrate 110 is substantially coplanar with a top surface 193 of the hard mask stack HM over the peripheral region PR the substrate 110) and underlying layers can be improved, thereby avoiding or preventing from forming voids in the hard mask stack HM. In contrast, if the gate fabrication process over peripheral region PR of the substrate 110 is performed prior to forming the hard mask stack HM, a peeling problem would occur over an interface between the peripheral region PR and the array region AR. That is, the first hard mask layer 180 of the hard mask stack HM would have voids due to uneven corner stress and then the second hard mask layer 190 would fill in the voids of the first hard mask layer 180, thereby causing worse planarity of the hard mask stack HM and worse performance of the semiconductor structure 100.

Thereafter, a patterned photoresist 200 is formed on the hard mask stack HM. The patterned photoresist 200 is in contact with the second hard mask layer 190 of the hard mask stack HM, and the patterned photoresist 200 has openings 202 exposing the second hard mask layer 190 of the hard mask stack HM. The openings 202 of the patterned photoresist 200 may respectively correspond to (e.g., be aligned to) the active areas 120 in the array region AR for subsequent processes of forming bit line features. The formation of patterned photoresist 200 includes forming a photoresist layer on the hard mask stack HM, and then performing a lithography process to form the patterned photoresist 200 with the openings 202. In some embodiments, the patterned photoresist 200 includes a positive photoresist. In some other embodiments, the patterned photoresist 200 includes a negative tone photoresist.

Figure 4A:
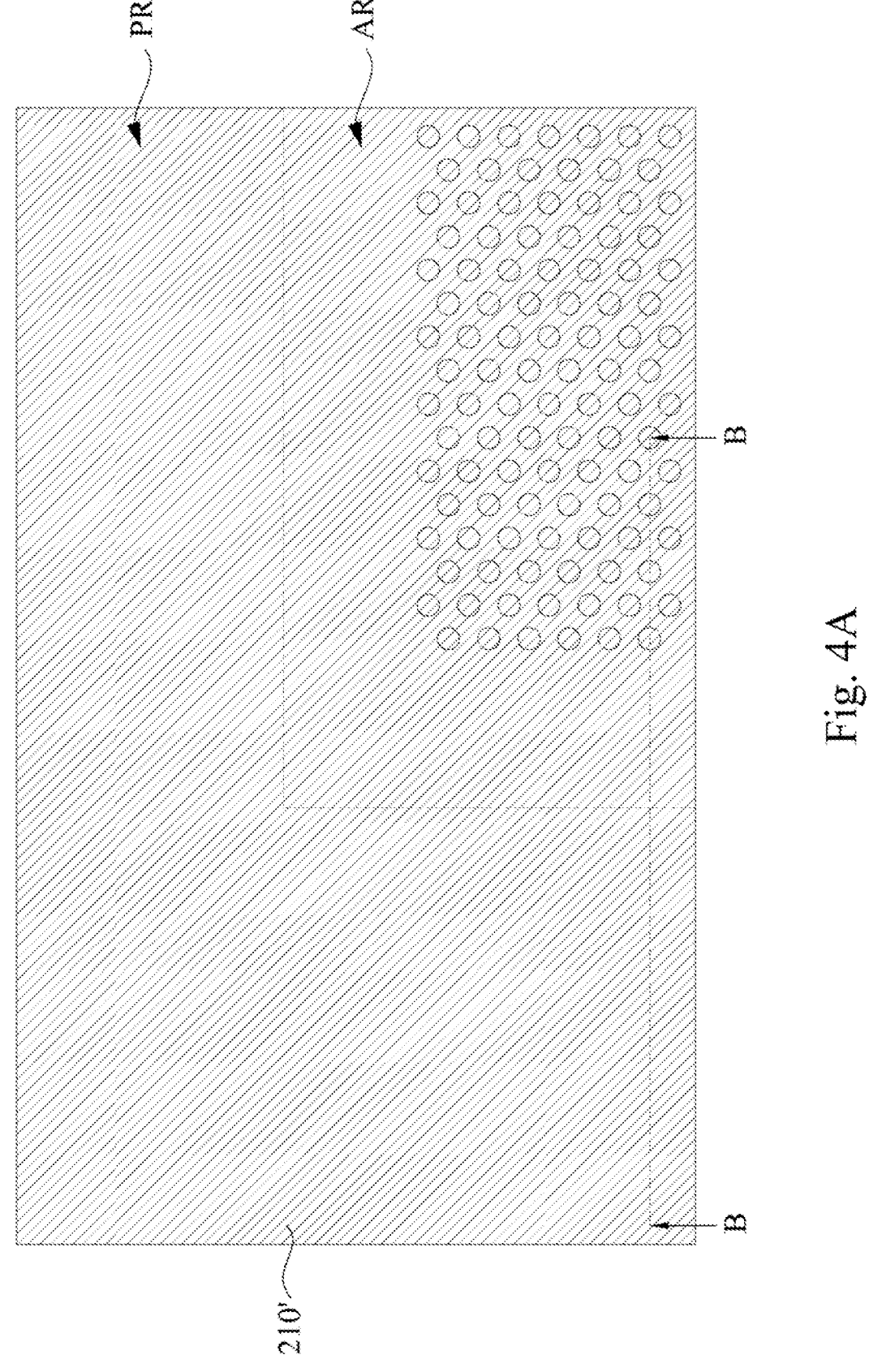
Figure 4B:
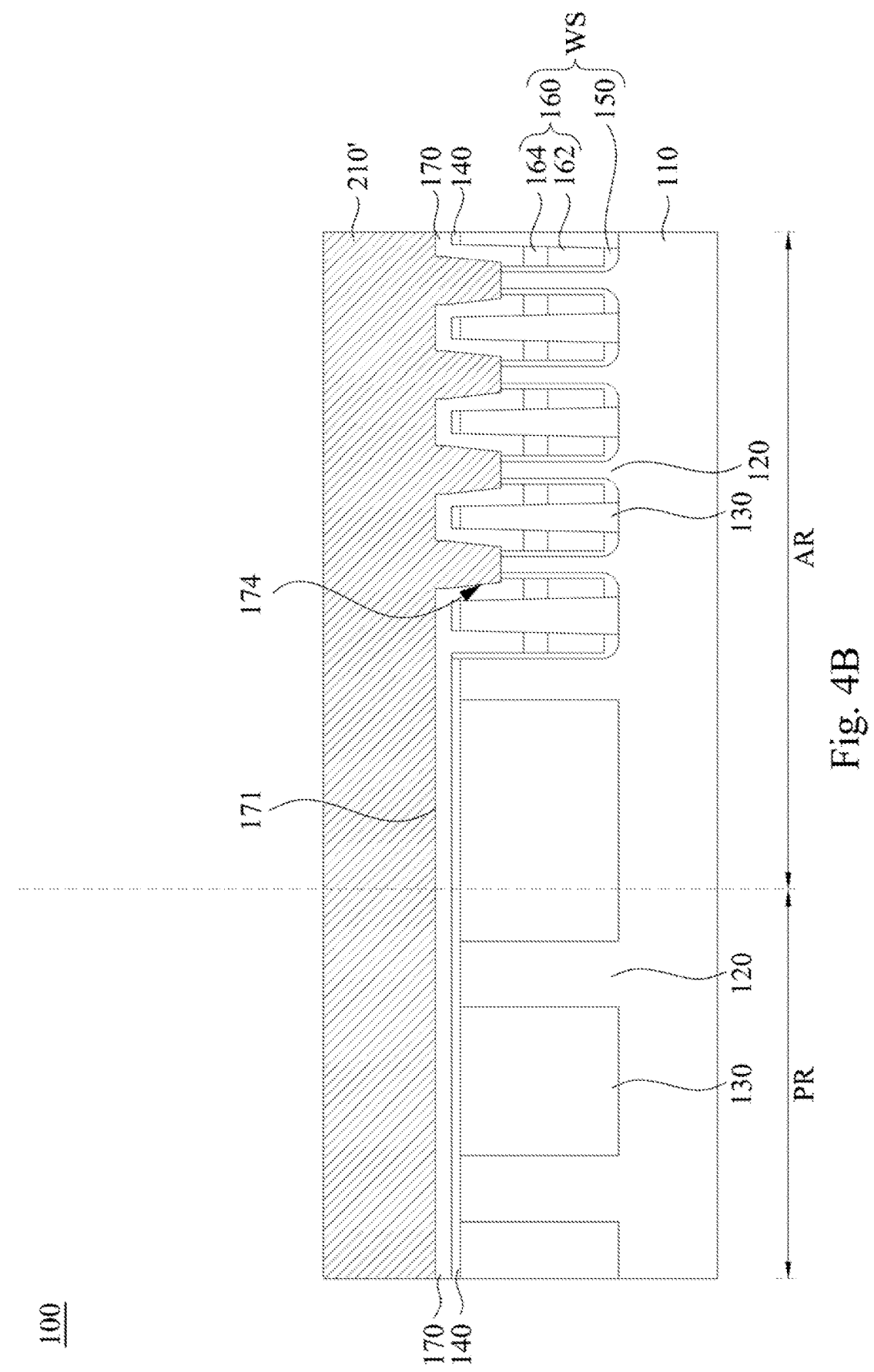
Figure 5A:
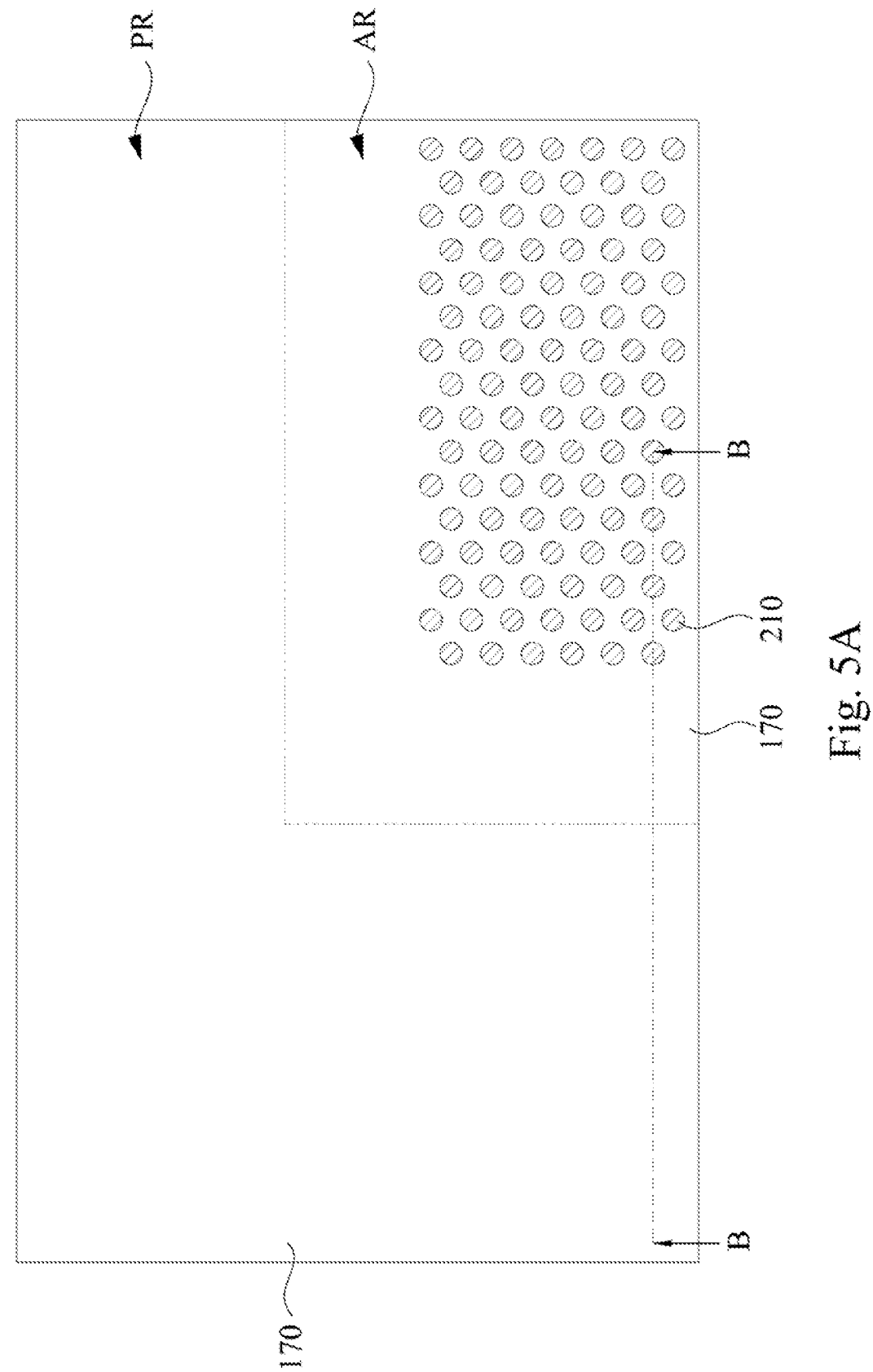
Figure 5B:
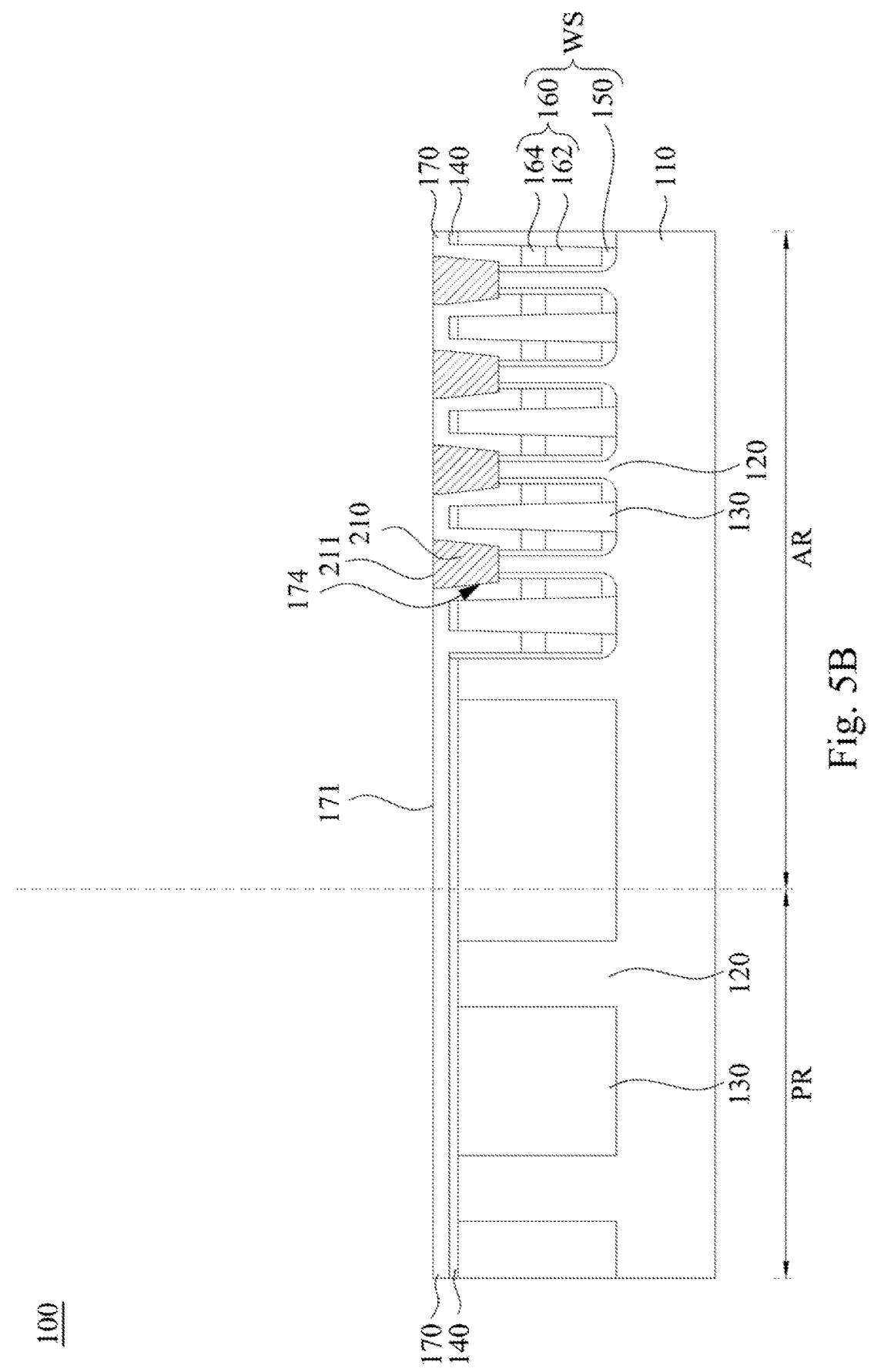

FIG. 4A is a top view of a step of manufacturing the semiconductor structure 100, and FIG. 4B is a cross-sectional view of the semiconductor structure 100 taken along line B-B in FIG. 4A. FIG. 5A is a top view of a step of manufacturing the semiconductor structure 100, and FIG. 5B is a cross-sectional view of the semiconductor structure 100 taken along line B-B in FIG. 5A. Referring to FIGS. 3A-5B, after forming the hard mask stack HM, bit line features 210 are formed in the first protection layer 170. In greater details, the hard mask stack HM and the first protection layer 170 below the hard mask stack HM are etched from the openings 202 of the patterned photoresist 200 to form openings 174 in the first protection layer 170. In other words, the openings 174 in the first protection layer 170 are formed by using the hard mask stack HM as an etch mask. In some embodiments, the openings 202 of the patterned photoresist 200 respectively define patterns of the openings 174. In some embodiments, forming the openings 174 in the first protection layer 170 further includes etching a portion of the isolation layer 140, portions of the dielectric layers 150 of the word line structures WS and portions of the active areas 120 such that the dielectric layers 150 of the word line structures WS and the active areas 120 are exposed.

After the openings 174 are formed, the patterned photoresist 200 may be removed by using a photoresist stripping process (e.g., ashing process). The hard mask stack HM is then removed in an etching process, such that the top surface 171 of the first protection layer 170 is exposed.

After forming the openings 174 in the first protection layer 170, a first conductive layer 210' is formed in the openings 174 and on the first protection layer 170. In some embodiments, the first conductive layer 210' are formed by using a chemical vapor deposition process, an atomic layer deposition process, a physical vapor deposition process, or other suitable deposition processes. The first conductive layer 210' may include semiconductor material (e.g., poly-silicon) or other suitable conductive materials. In some embodiments, an implantation process is performed on the first conductive layer 210' such that the first conductive layer 210' includes dopants. The dopants of first conductive layer 210' may be N-type dopants such as phosphorous (P), arsenic (As), antimony (Sb), combinations thereof, or the like. Alternatively, the dopants of first conductive layer 210' may be P-type dopants such as boron (B), $BF_2$, $BF_3$, combinations thereof, or the like. An anneal process may be performed to repair implant damage and to activate the implanted dopants.

As shown in FIG. 5A and FIG. 5B, a planarization process is performed to form the bit line features 210 in the first protection layer 170 over the array region AR of the substrate 110. In greater details, the planarization process is performed to remove the first conductive layer 210' over the top surface 171 of the first protection layer 170 and thus the bit line features 210 are formed in the first protection layer 170. In some embodiments, the first protection layer 170 serves as an etching stop layer for performing the planarization process, such that a top surface 211 of each of the bit line features 210 and the top surface 171 of the first protection layer 170 are substantially coplanar. In some embodiments, an entirety of the first conductive layer 210' over the peripheral region PR of the substrate 110 is removed. In some embodiments, the planarization process is a chemical mechanical planarization (CMP), an etch-back process, combinations thereof, or the like. In some embodiments, each of the bit line features 210 is in contact with the first protection layer 170, the dielectric layers 150 of the word line structures WS and the active areas 120. In some embodiments, as shown in FIG. 5A (top view), each of the bit line features 210 has a circle profile.

Figure 6A:
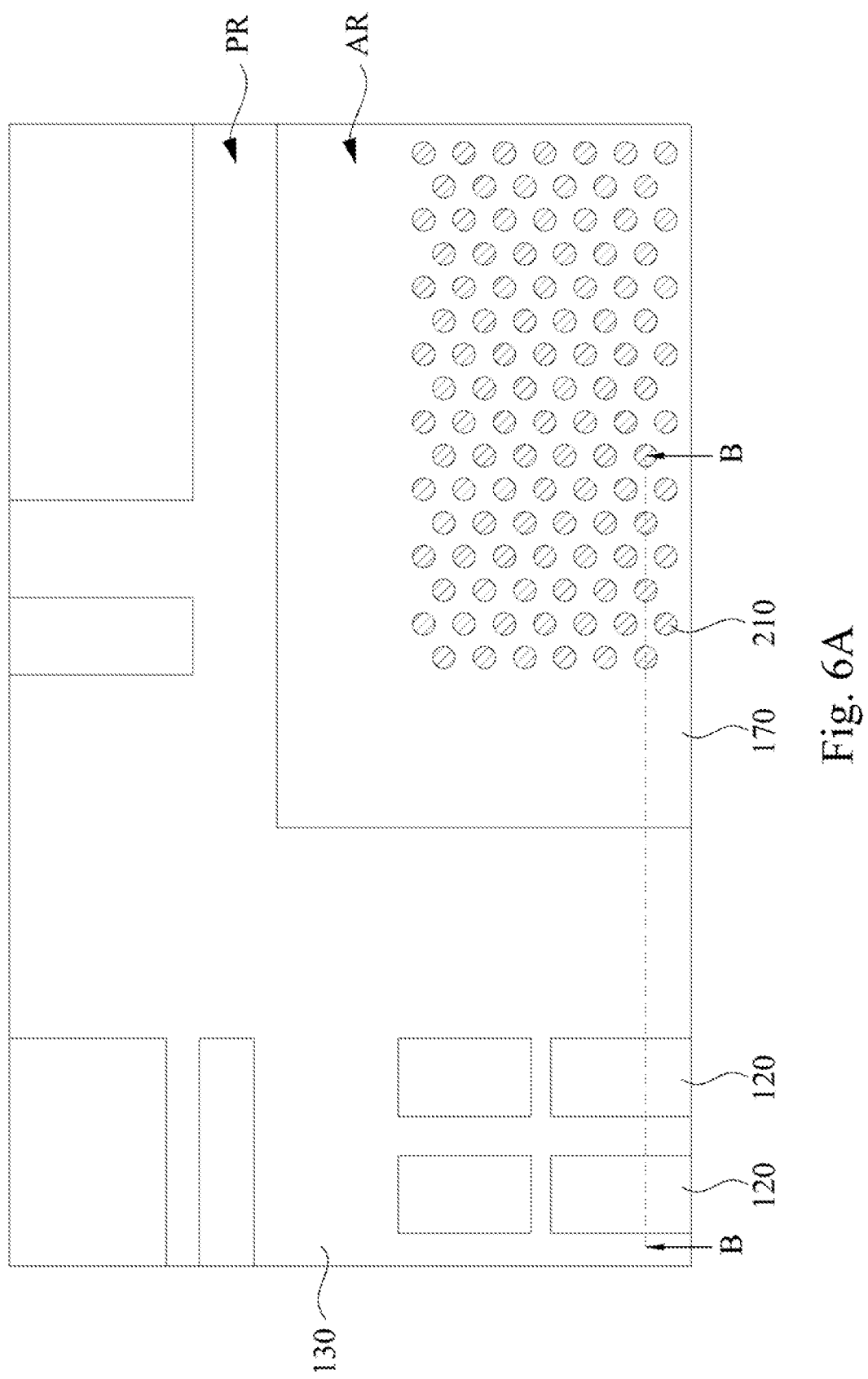
Figure 6B:
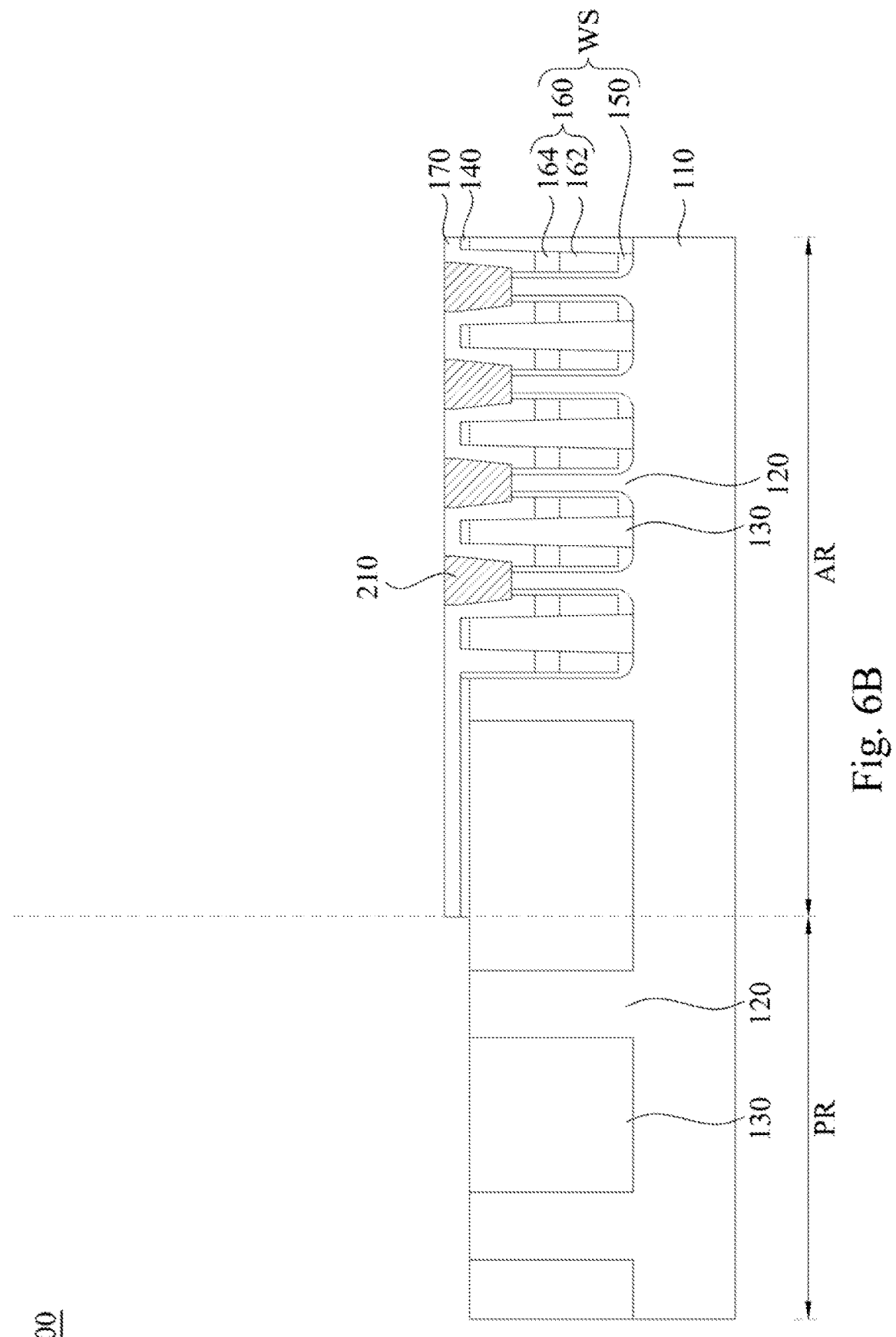

FIG. 6A is a top view of a step of manufacturing the semiconductor structure 100, and FIG. 6B is a cross-sectional view of the semiconductor structure 100 taken along line B-B in FIG. 6A. Referring to FIGS. 6A and 6B, the first protection layer 170 and the isolation layer 140 over the peripheral region PR of the substrate 110 are removed to expose the active areas 120 and the isolation structure 130. In some embodiments, the first protection layer 170 and the isolation layer 140 over the peripheral region PR of the substrate 110 are removed by performing an etching process such as a dry etching process.

Figure 7A:
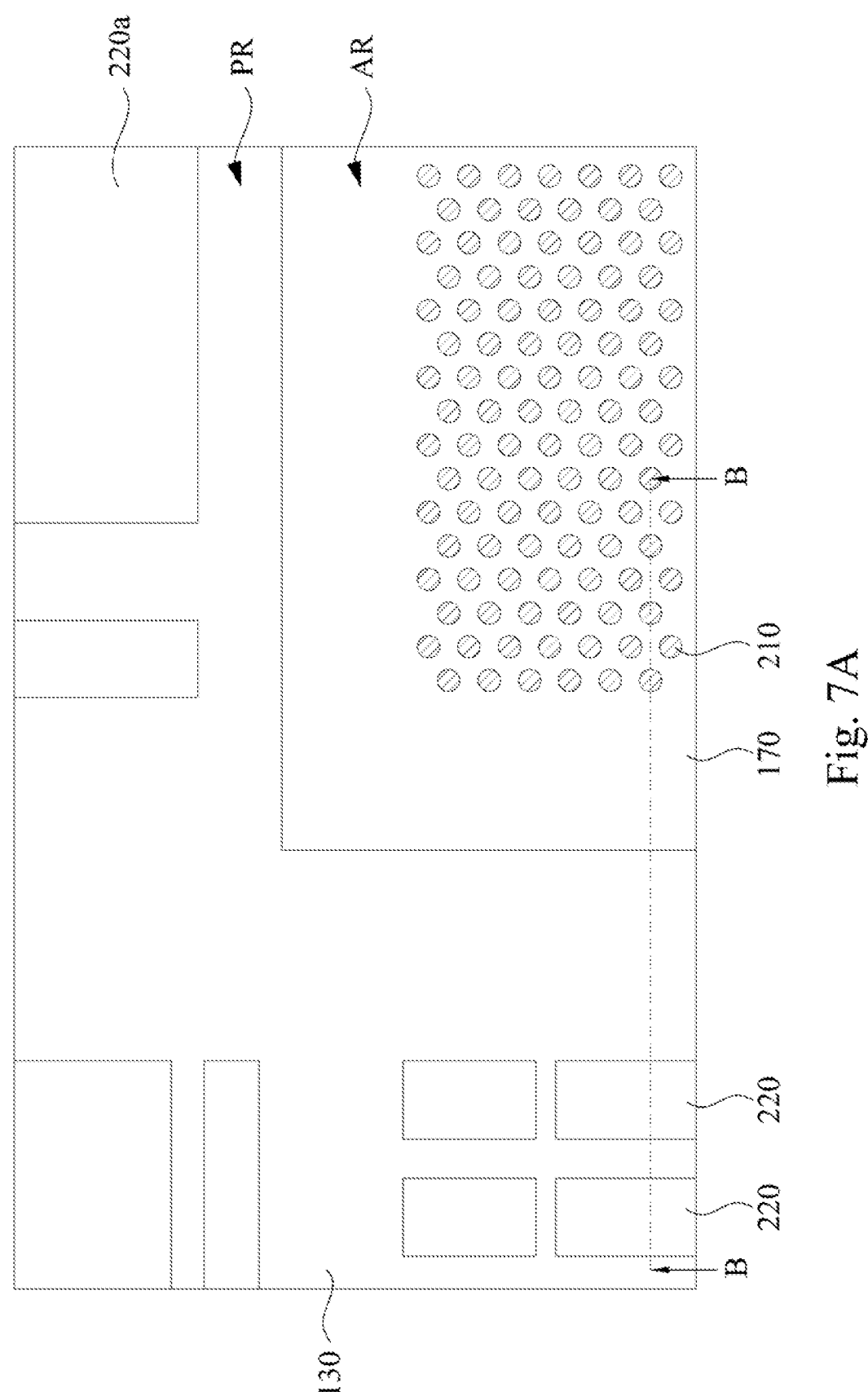
Figure 7B:
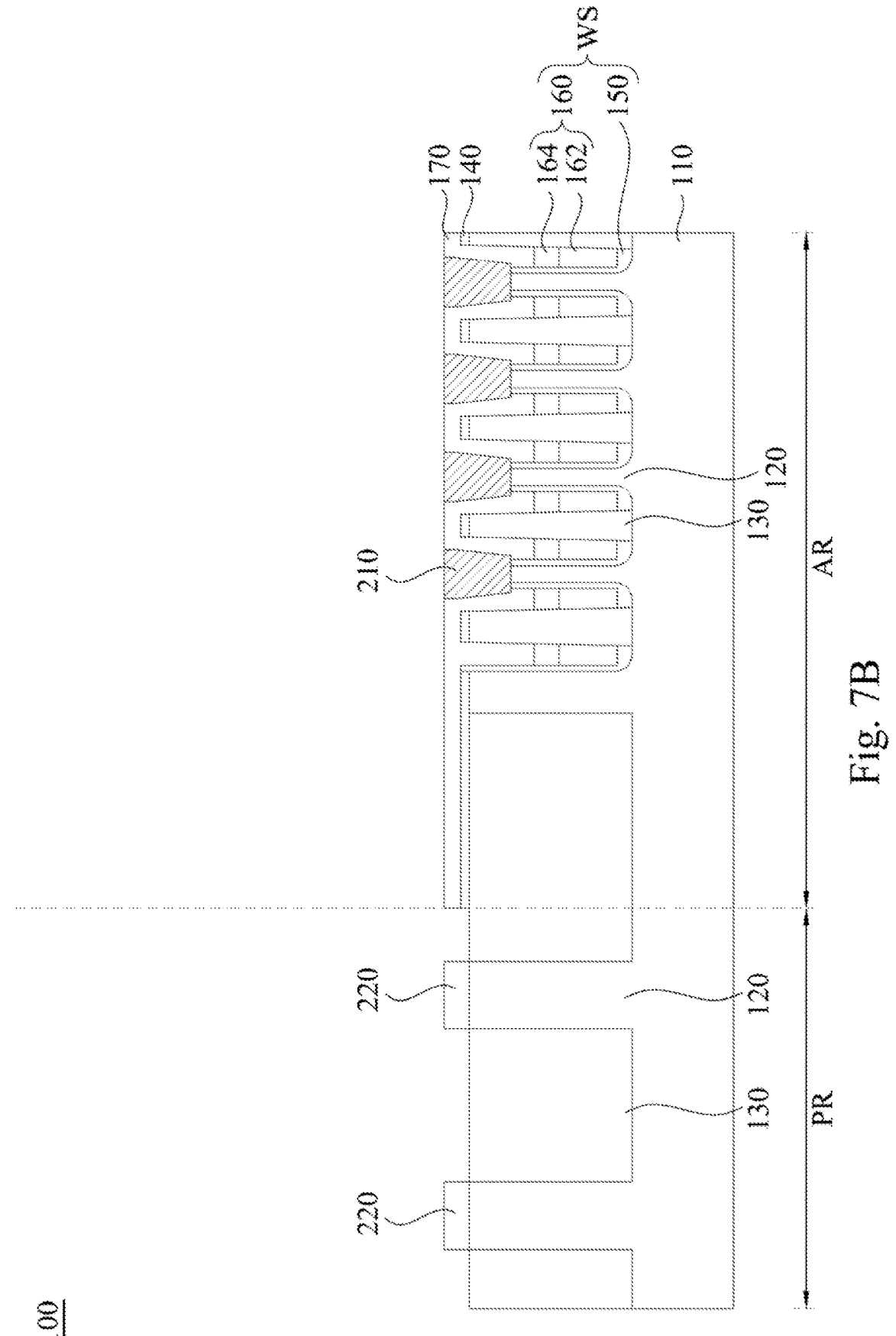

FIG. 7A is a top view of a step of manufacturing the semiconductor structure 100, and FIG. 7B is a cross-sectional view of the semiconductor structure 100 taken along line B-B in FIG. 7A. Referring to FIGS. 7A and 7B, after forming the bit line features 210, gate dielectric layers 220 are formed on the active areas 120 in the peripheral region PR of the substrate 110. Since forming the gate dielectric layers 220 on the active areas 120 in the peripheral region PR of the substrate 110 is performed after forming the bit line features 210, the planarity of the hard mask stack HM (see FIG. 3B) and underlying layers can be improved, thereby avoiding or preventing from forming voids in the hard mask stack HM (see FIG. 3B). In some embodiments, the gate dielectric layers 220 are formed by performing an oxidation process, such as wet or dry thermal oxidation in an ambient including an oxide, $H_2O$, combinations thereof, or the like. In some other embodiments, the gate dielectric layers 220 are formed by performing an in-situ steam generation (ISSG) process in an ambient environment of oxide, $H_2O$, combinations thereof, or the like. In some embodiments, the gate dielectric layers 220 include oxide (e.g., silicon oxide) or other suitable dielectric materials.

In some embodiments, gate dielectric layers 220a are formed on the active areas 120 in the peripheral region PR of the substrate 110, in which a thickness of the gate dielectric layers 220a is different from a thickness of the gate dielectric layers 220. For example, after the gate dielectric layers 220 are formed on the active areas 120 in the peripheral region PR of the substrate 110, a portion of the gate dielectric layers 220 are etched to expose the underlying active areas 120. Then, an oxidation process is performed again to form the gate dielectric layers 220a and increase the thickness of the gate dielectric layers 220 such that the gate dielectric layers 220 and the gate dielectric layers 220a have different thickness. For example, the thickness of the gate dielectric layers 220a is greater than the thickness of the gate dielectric layers 220.

Figure 8A:
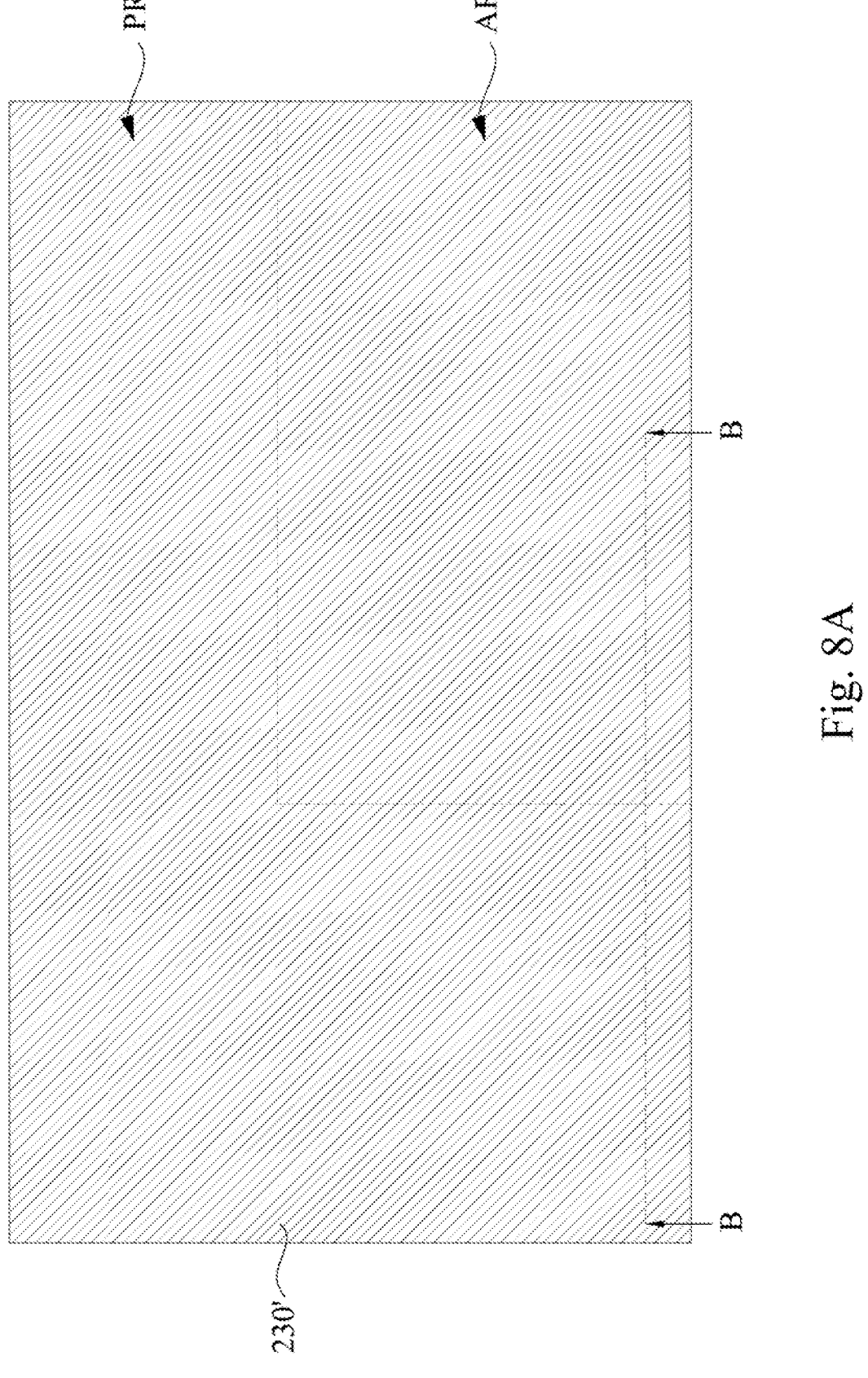
Figure 8B:
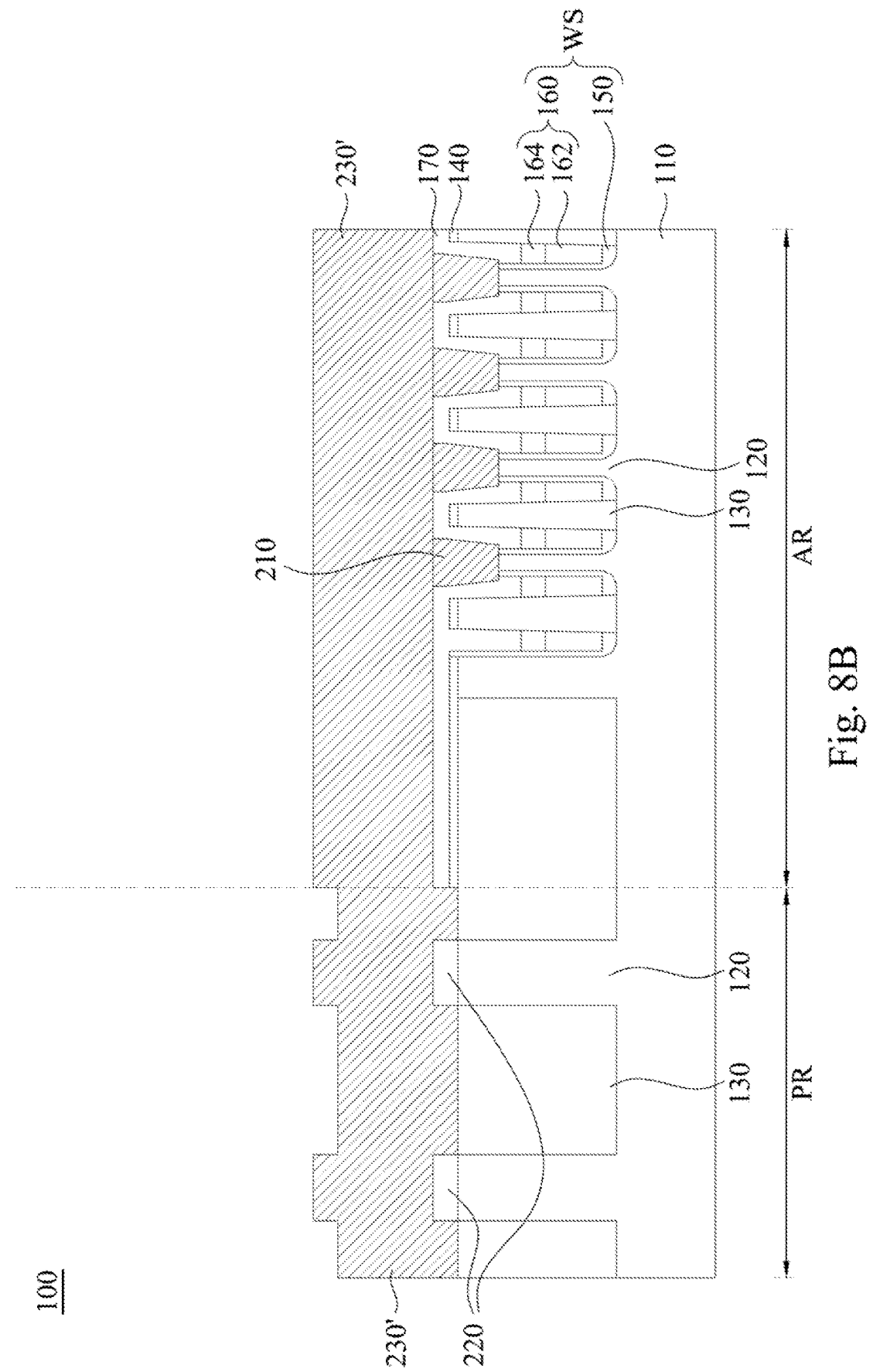

FIG. 8A is a top view of a step of manufacturing the semiconductor structure 100, and FIG. 8B is a cross-sectional view of the semiconductor structure 100 taken along line B-B in FIG. 8A. Referring to FIGS. 8A and 8B, a second conductive layer 230' is formed on the gate dielectric layers 220 (and the gate dielectric layers 220a, see FIG. 7A) over the peripheral region PR of the substrate 110 and on the first protection layer 170 over the array region AR of the substrate 110. The second conductive layer 230' is in contact with the isolation structures 130 and the gate dielectric layers 220 over the peripheral region PR of the substrate 110. Further, the second conductive layer 230' is in contact with the first protection layer 170 and the bit line features 210 over the array region AR of the substrate 110. In some embodiments, the second conductive layer 230' are formed by using a chemical vapor deposition process, an atomic layer deposition process, a physical vapor deposition process, or other suitable deposition processes. The second conductive layer 230' may include semiconductor material (e.g., polysilicon) or other suitable conductive materials. In some embodiments, an implantation process is performed on the second conductive layer 230' such that the second conductive layer 230' includes dopants. The dopants of second conductive layer 230' may be N-type dopants such as phosphorous (P), arsenic (As), antimony (Sb), combinations thereof, or the like. Alternatively, the dopants of second conductive layer 230' may be P-type dopants such as boron (B), $BF_2$, $BF_3$, combinations thereof, or the like. An anneal process may be performed to repair implant damage and to activate the implanted dopants. In some embodiments, the second conductive layer 230' and the bit line features 210 include the same material, such as doped polysilicon.

Figure 9A:
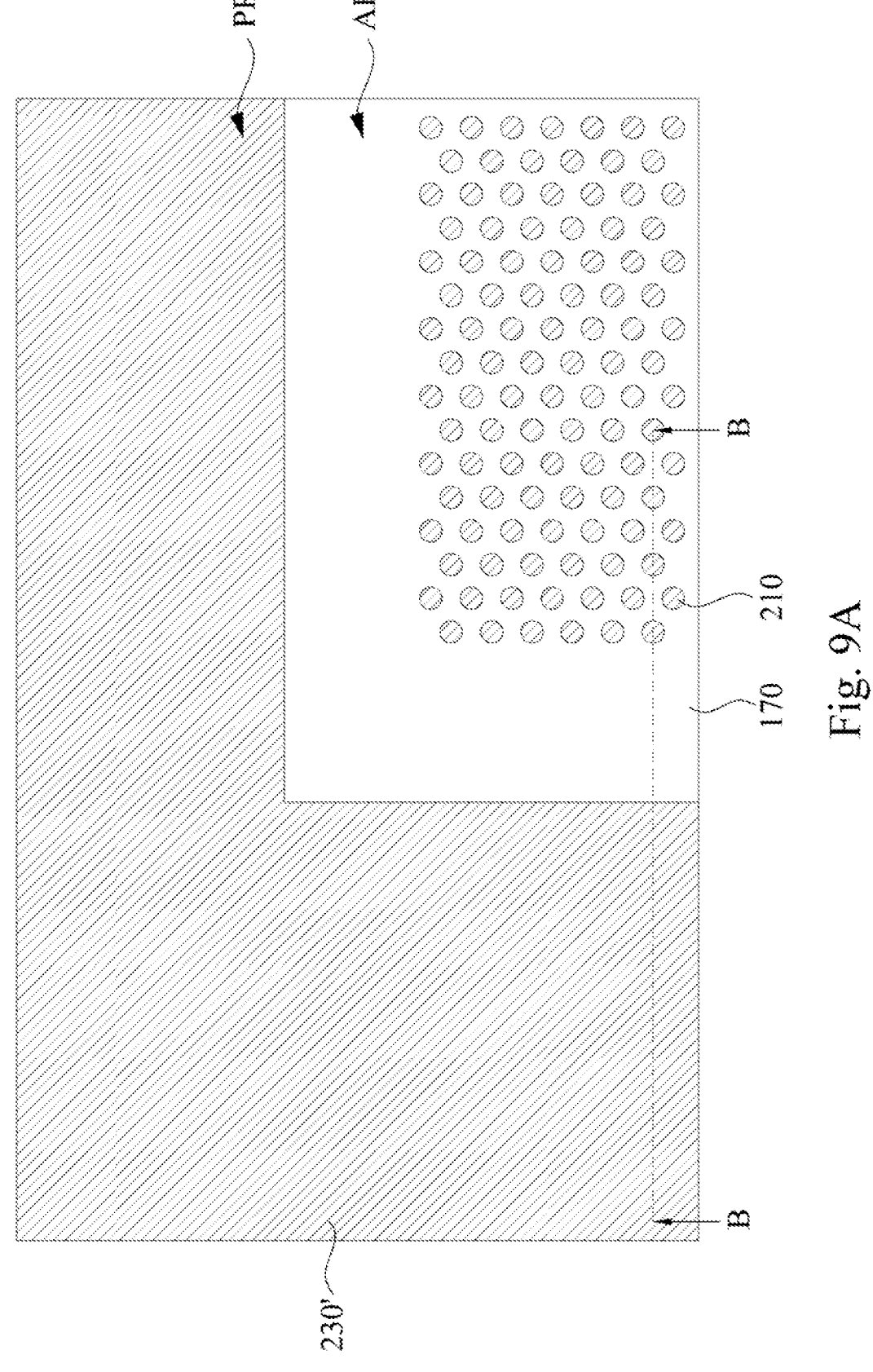
Figure 9B:
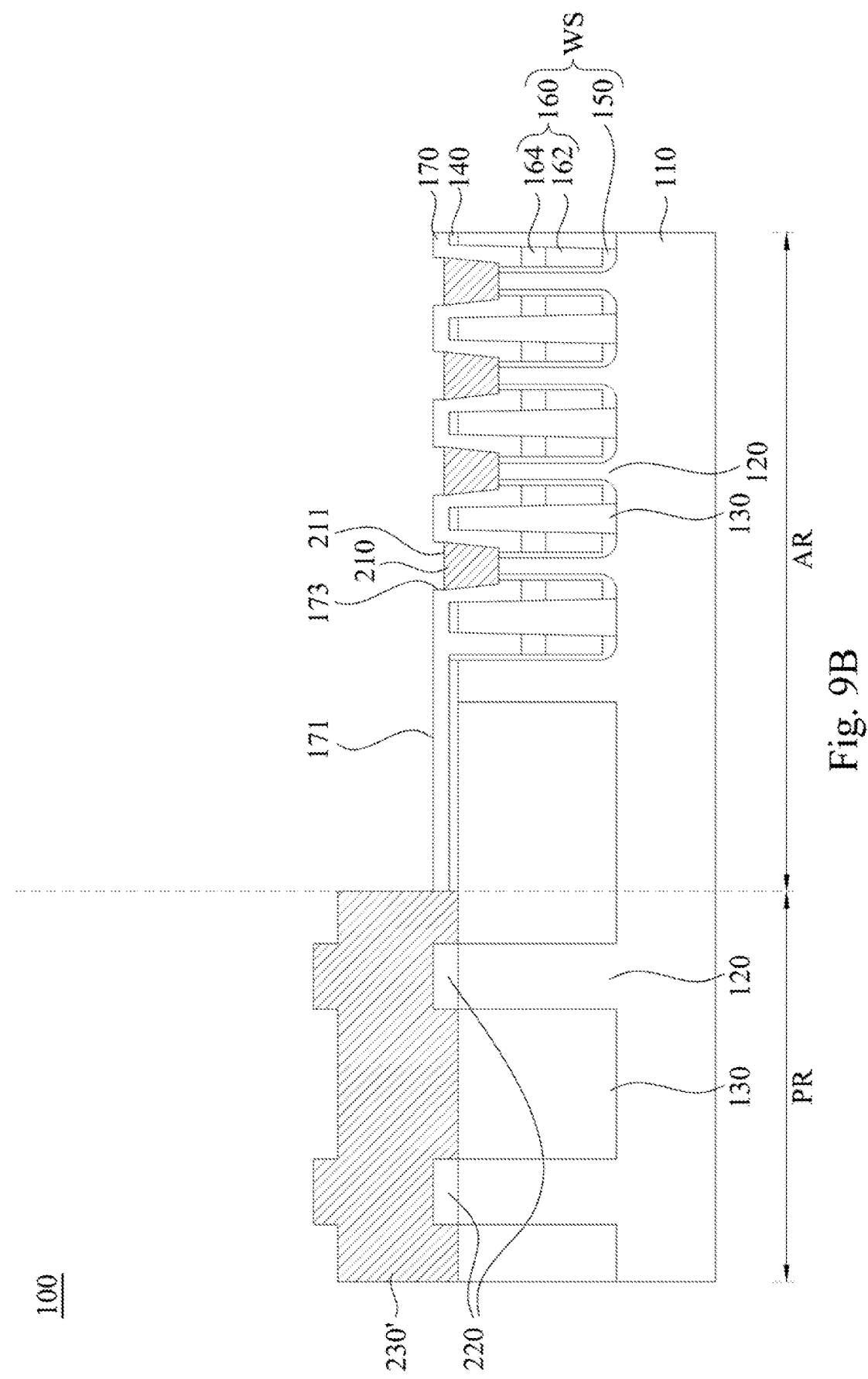

FIG. 9A is a top view of a step of manufacturing the semiconductor structure 100, and FIG. 9B is a cross-sectional view of the semiconductor structure 100 taken along line B-B in FIG. 9A. Referring to FIGS. 9A and 9B, an etching process is performed to remove the second conductive layer 230' over the array region AR of the substrate 110 such that the bit line features 210 and the first protection layer 170 are exposed. Specifically, an entirety of the second conductive layer 230' over the array region AR of the substrate 110 is removed. In some embodiments, the etching process further includes etching a portion of the bit line features 210 such that the top surface 211 of each of the bit line features 210 is below the top surface 171 of the first protection layer 170. The top surface 171 and a sidewall 173 of the first protection layer 170 may be exposed. In some embodiments, since the second conductive layer 230' and the bit line features 210 include the same materials, the second conductive layer 230' and the bit line features 210 over the array region AR of the substrate 110 are etched by using one etching process with the same etchant. In some embodiments, the etching process is a dry etching process.

Figure 10A:
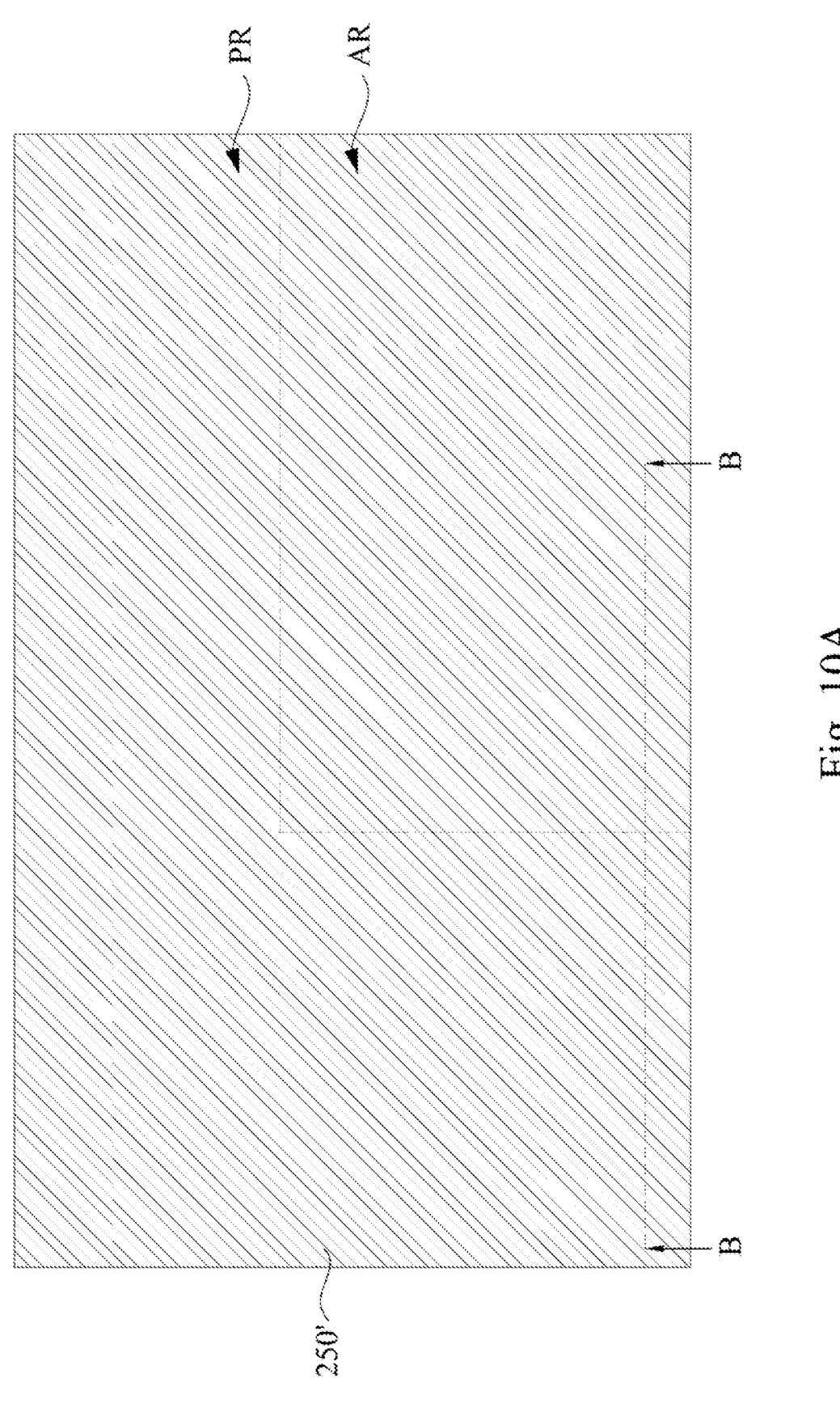
Figure 10B:
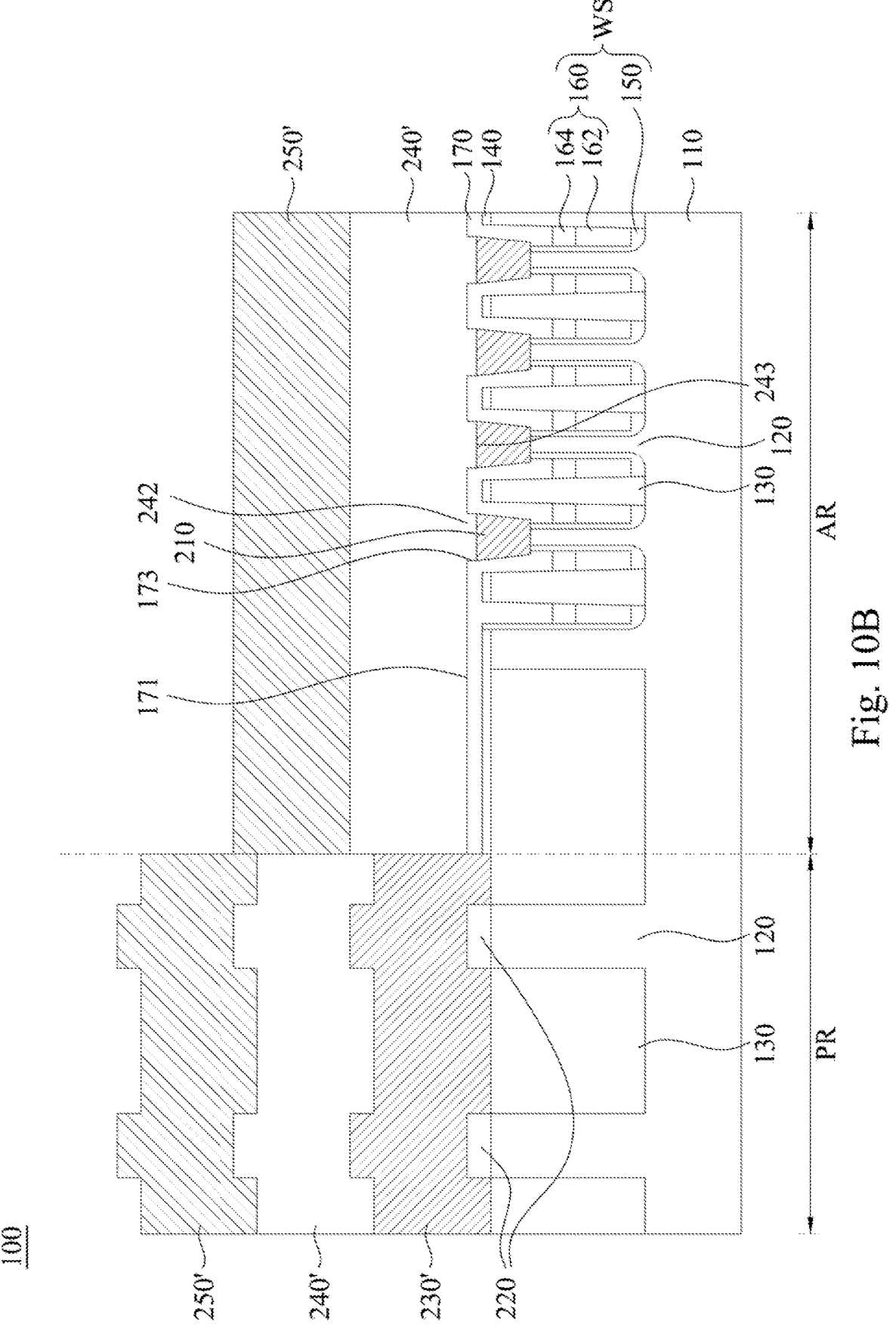

FIG. 10A is a top view of a step of manufacturing the semiconductor structure 100, and FIG. 10B is a cross-sectional view of the semiconductor structure 100 taken along line B-B in FIG. 10A. Referring to FIGS. 10A and 10B, a conductive structure 240' is formed on the second conductive layer 230' over the peripheral region PR of the substrate 110, and formed on the first protection layer 170 and the bit line features 210 over the array region AR of the substrate 110. The conductive structure 240' is in contact with the second conductive layer 230' over the peripheral region PR of the substrate 110. Further, the conductive structure 240' is in contact with the first protection layer 170 and the bit line features 210 over the array region AR of the substrate 110. In some embodiments, the conductive structure 240' has a portion 242 located in the first protection layer 170. In other words, the conductive structure 240' is in contact with the top surface 171 and the sidewall 173 of the first protection layer 170. In some embodiments, a bottom surface 243 of the conductive structure 240' is below the top surface 171 of the first protection layer 170. In some embodiments, the conductive structure 240' is formed by using a chemical vapor deposition process, an atomic layer deposition process, a physical vapor deposition process, or other suitable deposition processes. The conductive structure 240' and the second conductive layer 230' may include different materials. For example, the conductive structure 240' includes metal, while the second conductive layer 230' includes semiconductor material (e.g., polysilicon). In some embodiments, the conductive structure 240' is a multilayer stack including an adhesion layer, a barrier layer, a metal alloy layer and a filling layer. The adhesion layer, the barrier layer, the metal alloy layer and the filling layer of the conductive structure 240' may be formed in sequence. The metal alloy layer of the conductive structure 240' may be configured to reduce the resistance of the conductive structure 240'. The adhesion layer of the conductive structure 240' may be made of metal (e.g., titanium), the barrier layer of the conductive structure 240' may be made of metal nitride (e.g., titanium nitride), the metal alloy layer of the conductive structure 240' may be made of silicide (e.g., titanium silicide or tungsten silicide), and the filling layer of the conductive structure 240' may be made of metal (e.g., tungsten).

After forming the conductive structure 240', a second protection layer 250' is formed on the conductive structure 240'. In some embodiments, the second protection layer 250' is in contact with the conductive structure 240'. In some embodiments, the second protection layer 250' is formed by using a chemical vapor deposition process, an atomic layer deposition process, a physical vapor deposition process, or other suitable deposition processes. In some embodiments, the second protection layer 250', the first protection layer 170 and the isolation layer 140 include the same material. For example, the second protection layer 250', the first protection layer 170 and the isolation layer 140 include nitride, such as silicon nitride.

Figure 11A:
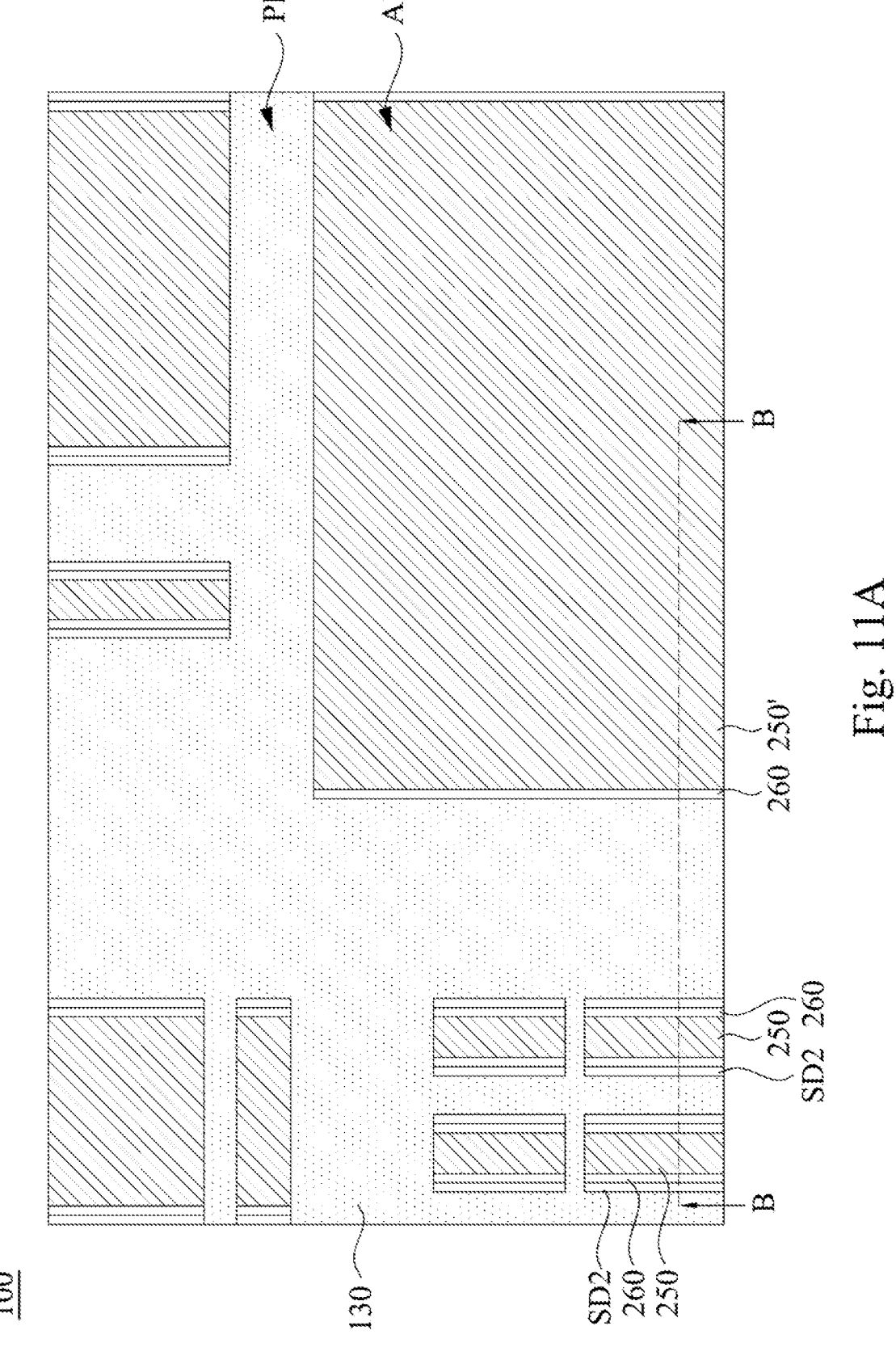
Figure 11B:
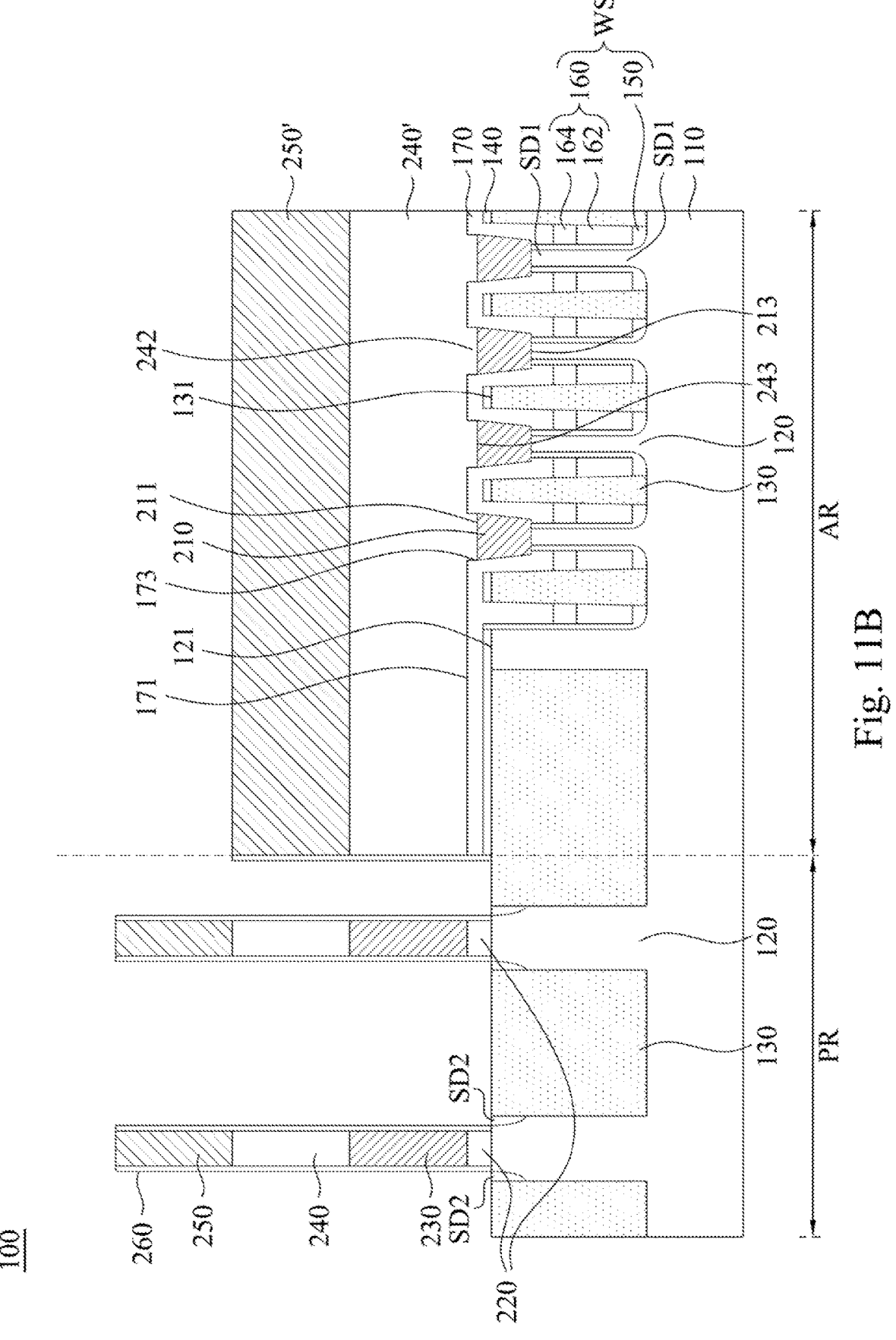

FIG. 11A is a top view of a step of manufacturing the semiconductor structure 100, and FIG. 11B is a cross-sectional view of the semiconductor structure 100 taken along line B-B in FIG. 11A. Referring to FIGS. 11A and 11B, the second conductive layer 230', the conductive structure 240' and the second protection layer 250' over the peripheral region PR of the substrate 110 are respectively patterned to form cap layers 250, gate conductors 240 and gate electrode layers 230. In some embodiments, the second conductive layer 230', the conductive structure 240' and the second protection layer 250' are patterned by using acceptable etching techniques, such as by using anisotropic etching processes. In some embodiments, the gate dielectric layers 220 are patterned to expose the active areas 120 in the peripheral region PR of the substrate 110.

In some embodiments, spacers 260 are formed along sidewalls of the cap layers 250, sidewalls of the gate conductors 240, sidewalls of the gate electrode layers 230 and sidewalls of the gate dielectric layers 220. In some embodiments, the spacers 260 include dielectric materials, such as nitride (e.g., silicon nitride). In some embodiments, forming the spacers 260 includes forming a spacer layer conformally over the cap layers 250, the gate conductors 240, the gate electrode layers 230 and the gate dielectric layers 220, and then performing an etching process to remove horizontal portions of the spacer layer. After the removal, the spacers 260 (i.e., vertical portions of the spacer layer) are remained.

In some embodiments, after forming the spacers 260, an ion implantation process is performed to dope active areas 120 in the peripheral region PR of the substrate 110 such that source/drain regions SD2 are formed in active areas 120. The source/drain regions SD2 are formed by the ion implantation process using the spacers 260, the cap layers 250 and the underlying layers (i.e., the gate conductors 240, the gate electrode layers 230 and the gate dielectric layers 220) as an implantation mask. Further, the source/drain regions SD2 are formed by the ion implantation process with N-type dopants or P-type dopants. Then, an annealing process may be performed to activate the implanted dopants of the source/drain regions SD2. In some embodiments, the source/drain regions SD2, the gate dielectric layers 220 and the gate electrode layers 230 are referred as transistors over the peripheral region PR of the substrate 110.

In some embodiments, the semiconductor structure 100 includes active areas 120, the word line structures WS, the first protection layer 170, the bit line features 210, the gate dielectric layers 220 and the gate electrode layers 230. The active areas 120 are located in the substrate 110, in which the substrate 110 has the array region AR and the peripheral region PR adjacent to the array region AR. The word line structures WS are located in the array region AR of the substrate 110. The first protection layer 170 covers the active areas 120 and the word line structures WS. The bit line features 210 are located in the first protection layer 170, in which the top surface 211 of each of the bit line features 210 is below the top surface 171 of the first protection layer 170. The gate dielectric layers 220 and the gate electrode layers 230 are located on the peripheral region PR of the substrate 110. The bit line features 210 and the gate electrode layers 230 may include the same material. For example, the bit line features 210 and the gate electrode layers 230 include doped polysilicon, polysilicon, other semiconductor material, or other suitable conductive materials. In some embodiments, the semiconductor structure 100 further includes the gate conductors 240 on the gate electrode layers 230 over the peripheral region PR of the substrate 110. Further, the semiconductor structure 100 further includes the conductive structure 240' on the first protection layer 170 and the bit line features 210 over the array region AR of the substrate 110. The conductive structure 240' has a portion 242 in the first protection layer 170. In some embodiments, since the conductive structure 240' and the gate conductors 240 are deposited in one deposition process, the conductive structure 240' and the gate conductors 240 include the same material. The conductive structure 240' has the bottom surface 243 in contact with the bit line features 210, and the bottom surface 243 of the conductive structure 240' is below the top surface 171 of the first protection layer 170. In some embodiments, the semiconductor structure 100 further includes the cap layers 250 respectively located on the gate conductors 240 over the peripheral region PR of the substrate 110 and the second protection layers 250' located on the conductive structure 240' over the array region AR of the substrate 110. The cap layers 250, the second protection layers 250' and first protection layer 170 may include the same material, such as silicon nitride. In some embodiments, the semiconductor structure 100 further includes the isolation structures 130 adjacent to the active areas 120, in which a bottom surface 213 of each of the bit line features 210 is below a top surface 131 of each of the isolation structures 130. Further, the bottom surface 213 of each of the bit line features 210 is below a topmost surface 121 of the active areas 120. In some embodiments, the semiconductor structure 100 further includes the isolation layer 140 over the array region AR of the substrate 110, in which the isolation layer 140 is located between the first protection layer 170 and the active areas 120. In some embodiments, the source/drain regions SD1 of the active areas 120 and the word line structures WS are referred as the transistors in the array region AR, and the source/drain regions SD2 of the active areas 120, the gate dielectric layers 220 and the gate electrode layers 230 are referred as the transistors over the peripheral region PR.

As mentioned above, since forming the gate dielectric layers on the active areas in the peripheral region of the substrate is performed after forming the bit line features, the planarity of the hard mask stack (e.g., a first top surface of the hard mask stack over the array region of the substrate is substantially coplanar with a second top surface of the hard mask stack over the peripheral region the substrate) and underlying layers can be improved, thereby avoiding or preventing from forming voids in the hard mask stack.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method of a semiconductor structure, comprising:

forming a substrate wherein the substrate has an active area in an array region and an active area in a peripheral region adjacent to the array region;

forming a word line structure in the array region of the substrate;

forming a first protection layer covering the active area in the array region of the substrate, the active area in the peripheral region of the substrate, and the word line structure;

forming a hard mask stack on the first protection layer;

forming a bit line feature in the first protection layer;

after forming the bit line feature, forming a gate dielectric layer on the active area in the peripheral region of the substrate; and forming a gate electrode layer on the gate dielectric layer.

2. The manufacturing method of claim 1, wherein forming the hard mask stack comprises:

forming a first hard mask layer covering the first protection layer, wherein the first hard mask layer comprises carbon; and forming a second hard mask layer covering the first hard mask layer.

3. The manufacturing method of claim 1, wherein forming the bit line feature comprises:

forming an opening in the first protection layer by using the hard mask stack as an etch mask;

forming a first conductive layer in the opening and on the first protection layer; and performing a planarization process to form the bit line feature in the first protection layer over the array region of the substrate.

4. The manufacturing method of claim 3, wherein forming the opening in the first protection layer further comprises etching a portion of the active area in the array region of the substrate.

5. The manufacturing method of claim 3, further comprising:

removing the hard mask stack to expose a top surface of the first protection layer prior to forming the first conductive layer.

6. The manufacturing method of claim 1, further comprising:

etching the first protection layer over the peripheral region of the substrate to expose the active area in the peripheral region of the substrate after forming the bit line feature.

7. The manufacturing method of claim 1, wherein forming the gate electrode layer comprises:

forming a second conductive layer on the gate dielectric layer over the peripheral region of the substrate and on the first protection layer over the array region of the substrate;

performing an etching process to remove the second conductive layer over the array region of the substrate such that the bit line feature is exposed; and patterning the second conductive layer over the peripheral region of the substrate to form the gate electrode layer.

8. The manufacturing method of claim 7, wherein performing the etching process further comprises etching a portion of the bit line feature.

9. The manufacturing method of claim 7, wherein the etching process is performed such that a top surface and a sidewall of the first protection layer are exposed.

10. The manufacturing method of claim 7, further comprises:

forming a conductive structure over the array region of the substrate and over the peripheral region of the substrate; and patterning the conductive structure over the peripheral region of the substrate to form a gate conductor.

11. The manufacturing method of claim 10, wherein forming the conductive structure is performed such that the conductive structure has a portion in the first protection layer.

12. The manufacturing method of claim 10, further comprises:

forming a second protection layer on the conductive structure; and patterning the second protection layer over the peripheral region of the substrate to form a cap layer.

13. The manufacturing method of claim 1, further comprising:

forming an isolation structure adjacent to the active area in the array region of the substrate and the active area in the peripheral region of the substrate, wherein the word line structure comprises a dielectric layer and a word line, the dielectric layer covers a sidewall of the active area in the array region of the substrate, and the word line is between the isolation structure and the active area in the array region of the substrate.

\* \* \* \* \*